(12) United States Patent
Sotoyama

(10) Patent No.: US 7,635,948 B2
(45) Date of Patent: Dec. 22, 2009

(54) LIGHT EMITTING APPARATUS AND LIGHT EMITTING METHOD

(75) Inventor: Wataru Sotoyama, Minami-Ashigara (JP)

(73) Assignee: FUJIFILM Corporation, Tokyo (JP)

( * ) Notice: Subject to any disclaimer, the term of this patent is extended or adjusted under 35 U.S.C. 154(b) by 631 days.

(21) Appl. No.: 11/389,081

(22) Filed: Mar. 27, 2006

(65) Prior Publication Data

US 2007/0086180 A1  Apr. 19, 2007

(30) Foreign Application Priority Data

Mar. 28, 2005  (JP) ............... 2005-092331

(51) Int. Cl.
*H05B 33/00* (2006.01)
(52) U.S. Cl. .................. 313/506; 313/112; 313/504; 313/114
(58) Field of Classification Search .................. None
See application file for complete search history.

(56) References Cited

U.S. PATENT DOCUMENTS

| | | | | |
|---|---|---|---|---|
| 6,081,632 A | * | 6/2000 | Yoshimura et al. | 385/5 |
| 6,330,262 B1 | * | 12/2001 | Burrows et al. | 372/39 |
| 6,396,860 B1 | * | 5/2002 | Kozlov et al. | 372/39 |
| 6,704,335 B1 | * | 3/2004 | Koyama et al. | 372/43.01 |
| 6,963,597 B2 | * | 11/2005 | Evans et al. | 372/102 |
| 7,260,135 B2 | * | 8/2007 | Shimomura et al. | 372/87 |
| 7,292,614 B2 | * | 11/2007 | Cok et al. | 372/43.01 |
| 7,376,169 B2 | * | 5/2008 | Henrichs | 372/99 |
| 7,449,724 B2 | * | 11/2008 | Yamazaki et al. | 257/98 |

FOREIGN PATENT DOCUMENTS

| | | |
|---|---|---|
| JP | 4-242982 A | 8/1992 |
| JP | 2002-111101 A | 4/2002 |
| JP | 2002-156536 A | 5/2002 |
| JP | 3675665 B2 | 5/2005 |

OTHER PUBLICATIONS

N. C. Greenham et al., Advanced Materials 1994. vol. 6, No. 6, pp. 491 to 494.

* cited by examiner

*Primary Examiner*—Ashok Patel
(74) *Attorney, Agent, or Firm*—Birch, Stewart, Kolasch & Birch, LLP

(57) ABSTRACT

A light emitting apparatus of the present invention includes: an EL emitting unit including at least a light emitting layer which generates an EL light; and a pair of light blocking layers arranged such that they sandwich the light emitting layer so that the layers block the EL light generated in the light emitting layer and that the EL light is radiated only from the end of the light emitting layer; and a light emitting unit which optically guides the EL light radiated from the end of the light emitting layer and emits a light having a wavelength equal to or different from that of the EL light. The EL light is emitted only from the end of the light emitting layer since the EL light generated in the light emitting layer is blocked by the pair of light blocking layers. This emitted EL light is optically guided by the light emitting unit and emitted as it is or a light having a different wavelength from the EL light.

20 Claims, 3 Drawing Sheets

LIGHT EMITTING APPARATUS AND LIGHT EMITTING METHOD

BACKGROUND OF THE INVENTION

1. Field of the Invention

The present invention relates to an optical waveguide light emitting apparatus and light emitting method which employ an electroluminescent (EL) emission as a light source and can emit the EL light or EL-oriented light as a linear beam or a laser beam.

2. Description of the Related Art

Conventionally, linear beams have been heavily used, and among the linear beams, a laser beam has been favorably used in various areas since it is a highly directional coherent light with a sharp spectrum width. For example, a diode laser apparatus which employs a solid laser of an inorganic semiconductor such as GaAs, i.e. semiconductor laser, is widely known as an emitting apparatus of the laser beam. In general, the diode laser apparatus uses a light emission induced by a recombination of injected electrons and holes at a laser cavity, and it is mandatory for the use to satisfy the both electric conditions, e.g. potential drop and Ohmic loss, and the optical conditions, e.g. refractive index difference. Regarding the inorganic semiconductor, a relatively thick layer may be used without severely sacrificing the potential drop and Ohmic loss since it shows high carrier mobility, and a planar waveguide laser and a distributed Bragg reflection vertical cavity laser may be easily manufactured since a semiconductor material with a large refractive index difference can be used. Thus, an inorganic semiconductor laser which uses the inorganic semiconductor has been actively developed since it satisfies the both conditions relatively easily.

However, the inorganic semiconductor laser has various problems. For example, the inorganic semiconductor laser is expensive. Also, the apparatus thereof is large in size, and the modulation is not easy. Moreover, since the wavelength of a laser beam is specified by the types of the semiconductor materials, a laser beam having an arbitrary wavelength cannot be obtained, and the applications are limited. The production of a light emitting apparatus which costs less and is smaller in size than a conventional semiconductor laser, provides easy modulation and emits a linear beam having a different wavelength from that of a conventional laser beam has been desired.

Under such circumstances, an apparatus or a method which can emit a linear beam by means of an organic EL element has been proposed (Japanese Patent (JP-B) No. 3675665). The proposed apparatus is comprised of a first region and a second region, where the first region is composed of a flat light emitting element (organic EL element) including a conductor layer (positive electrode) 26, an organic light emitting layer (EL emitting layer) 27 and a conductor (negative electrode) 28 laminated in this order, and the second region is composed of a flat optical waveguide including a cladding layer 31, a core layer 32 and a cladding layer 33 laminated in this order. The apparatus extracts an incoherent EL light generated in the organic light emitting layer (EL emitting layer) 27 from the side of the conductor (negative electrode) 28, and it absorbs this incoherent EL light into the core layer 31. A light emitting material existing in the core layer 31 is excited by the EL light to emit a coherent light, and the apparatus waveguides the coherent light from the light emitting material and emits an output light 33 from the end of the core layer 31.

However, about 80% of the incoherent EL light generated in the organic light emitting layer 27 in the organic EL element leaks from the end of the organic light emitting layer 27, and only 20% of the total incoherent light is radiated to the flat optical waveguide from the layer surface of the organic light emitting layer 27 (N. C. Greenham, et al. Advanced Materials, Vol. 6, p. 491 (1994)), indicating the low utilization efficiency of the EL light 29 and the insufficient luminous intensity. In addition, in order to provide a laser oscillation in a flat medium by means of a light excitation, the density of the excited molecules per unit area in the medium is important instead of the amount of the excited molecules in the medium as a whole. The flat optical waveguide of this apparatus should have an area approximately equal to that of the layer surface in the organic EL emitting layer. Naturally, the excitation density should be approximately equal to that of the organic EL emitting layer. However, the excitation density of a light emitting layer in an organic EL element is in general smaller than the excitation density required for laser oscillation. Therefore, the apparatus has a problem that a laser oscillation cannot be provided.

Furthermore, Japanese Patent Application Laid-Open (JP-A) No. 2002-156536 proposes an organic semiconductor layer which is composed of a positive electrode layer, a hole transport layer, a light emitting layer including an organic pigment material, an electron transport layer and a negative electrode layer. Since the positive electrode layer of this organic semiconductor layer is an ITO layer disposed on a glass substrate, absorption loss occurs in the EL light generated in the light emitting layer. In order to protect this absorption loss and at the same time to extract efficiently the EL light from the light emitting layer, the thickness of the electron transport layer and the electron transport layer should be increased, i.e. the thickness of 0.1 μm at present should be increased to several μm. Also, the electric current density which is injected in the element should be largely increased, i.e. the electric current density of up to 10 A/cm$^2$ at present should be increased to 1,000 A/cm$^2$. For these increases, the charge transport properties of the hole transport layer and the electron transport layer should be significantly improved, but it is difficult to find such hole transport layer materials and electron transport layer materials. Also, the proposal of this organic semiconductor laser does not disclose a light guiding method of the EL light extracted from the light emitting layer. Therefore, the organic semiconductor laser is not guaranteed for the practical performance and thus cannot be used as an apparatus with the performance equal or superior to that of a conventional laser apparatus.

Meanwhile, JP-A Nos. 2002-111101 and 04-242982 propose an optical waveguide laser light source apparatus which contains an optical waveguide core and an optical waveguide cladding. This apparatus uses a semiconductor laser as a light source, and thus it has various problems as mentioned above. That is, the apparatus is expensive and large in size, and the application is limited because the wavelength of a laser beam is specified by the types of the semiconductor materials and a laser beam at an arbitrary wavelength cannot be obtained.

Therefore, a laser apparatus which uses an EL element as a light source has not yet been commercially available, and the production of an optical waveguide light emitting apparatus and light emitting method which use an EL element as a light source, can emit an EL light generated in the organic EL element or an EL-oriented light as a linear beam or a laser beam and can be favorably used in various areas have been desired.

The present invention is aimed at providing a high-performance light emitting apparatus which resolves the conventional problems, can emit an electroluminescent (EL) light or an EL-oriented light as a linear beam or a laser beam, costs less and is smaller in size than the semiconductor laser, can emit a linear beam having a wavelength different from that of a conventional laser beam, enables easy modulation and is favorable in various fields; and a light emitting method thereof.

SUMMARY OF THE INVENTION

A light emitting apparatus of the present invention includes: an EL emitting unit including at least a light emitting layer which generates an EL light and a pair of light blocking layers which blocks the EL light generated in the light emitting layer without transmission and allows the radiation of the EL light only from the end of the light emitting layer, where the light blocking layers are arranged such that they sandwich the light emitting layer; and a light emitting unit which optically guides the EL light radiated from the end of the light emitting layer and emits a light having a wavelength equal to or different from that of the EL light.

In a light emitting apparatus of the present invention, the EL emitting unit generates an electroluminescent (EL) light in the light emitting layer. That is, the EL emitting unit functions as an EL element. The EL light generated in the light emitting layer is blocked by the pair of light blocking layers disposed such that they sandwich the light emitting layer in between; therefore, the light emitting layer does not have to be thickened, and the EL light is radiated efficiently from the end (outer periphery) of the light emitting layer regardless of the thickness of the light emitting layer. On one hand, only about 20% of the EL light is radiated from the layer surface of the light emitting layer when the EL light generated in the light emitting layer is radiated from the layer surface. On the other hand, about 80% of the EL light is radiated from the end (outer periphery) of the light emitting layer when the EL light is radiated from the end (outer periphery) of the light emitting layer, and moreover, the 20% of the EL light radiated originally from the layer surface of the light emitting layer is radiated from the end (outer periphery) of the light emitting layer; as a result, about 100% of the EL light is radiated from the end (outer periphery) of the light emitting layer. The light emitting apparatus can utilize about 100% of the EL light and thus have high light utilization efficiency. Also, the EL light radiated from the end (outer periphery) of the light emitting layer is optically guided by the light emitting unit and emitted as it is or as a light modulated to have a wavelength different from that of the EL light. As a result, the light emitting apparatus can emit a light having the wavelength equal to or different from that of the EL light as a linear beam or a laser beam.

A light emitting apparatus of the present invention preferably has an aspect that the light emitting unit is equipped with an optical guiding member which optically guides the EL light radiated from the end of the light emitting layer. The optical guiding member equipped in the light emitting apparatus can suppress or reduce various losses, e.g. connection loss and transmission loss, or attenuations. When the optical guiding member is designed in the form of a linear waveguide, the excitation density of the light emitted from the light emitting unit may be adjusted to the desired value by adjusting the size (area) of the light emitting layer of the EL emitting unit (EL element), and thus it is possible to increase sufficiently the excitation density. In other words, the luminous energy is proportional to the square of the radius of the EL emitting unit while the density of the driving current in the EL emitting unit is constant and directly proportional to the size (area) of the light emitting layer of the EL emitting unit. On the other hand, since the length of the linear waveguide located opposite to the EL emitting unit, i.e. located surrounding the EL emitting unit, is directly proportional to the radius of the EL emitting unit. Therefore, the increase in the size (area) of the light emitting layer in the EL emitting unit monotonously increases the excitation density in the linear waveguide. As a result, the adjustment of the size (area) of the light emitting layer in the EL emitting unit can turn the light emitted from the light emitting apparatus into a laser beam, i.e. provide a laser oscillation.

In addition, a light emitting apparatus of the present invention preferably has an aspect that the light emitting unit is equipped with an optical guiding part which optically guides the EL light and a non-optical guiding part which does not optically guides the EL light and that the optical guiding part includes a light emitting material which absorbs the EL light radiated from the light emitting layer and emits a light. In the light emitting apparatus, the light emitting material of the optical guiding part absorbs the EL light and transits to an excited state, and it emits a light when it returns to the ground state (the EL light is modulated or amplified to a light having a different wavelength from that of the EL light). Therefore, an emission of a light having a different wavelength from that of the EL light to the exterior is induced, and the resulting light has superior intensity and luminous energy. Here, the increase in the electric current injected in the light emitting layer in the EL emitting unit (EL element) increase the luminous intensity and the luminous energy of the EL light generated in the light emitting layer, and this increase in the luminous intensity and the luminous energy of the EL light increases the excitation density of the light emitting material as well. When the excitation density of the light emitting material exceeds its threshold, the laser oscillation occurs, and a laser beam is emitted from the light emitting apparatus.

Furthermore, a light emitting apparatus of the present invention preferably has an aspect that the optical guiding part has a loop structure and that the optical guiding member functions as a light resonator. The optical guiding part of the light emitting apparatus has a loop structure, and the EL light optically guided into the optical guiding part circles in the optical guiding part. The circling light resonates under the condition where the phase of the circling light coincides with the original phase. A laser beam to be emitted has a wavelength of the resonance condition, and the light emitting apparatus can emit a laser beam.

Furthermore, a light emitting apparatus of the present invention preferably has an aspect that the refractive index of the non-optical guiding part is smaller than the refractive index of the optical guiding part. In the light emitting apparatus, the refractive index difference between the optical guiding part and the non-optical guiding part prevents the EL light, which is likely to leak out to the exterior from the periphery, from entering the non-optical guiding part; the EL light is reflected at the boundary between the optical guiding part and the non-optical guiding part, and it proceeds within the optical guiding part. Therefore, the optical guiding part serves as an optical waveguide, effectively suppressing the leak of the light proceeding in the optical guiding part to the exterior as well as reducing or suppressing the loss of the light guided into the optical guiding part, e.g. transmission loss, or attenuations, and it can emit a light with large luminous intensity.

Also, a light emitting apparatus of the present invention preferably has the optical guiding part arranged near the periphery of the light emitting layer. In the light emitting apparatus, the EL light emitted from the end (outer periphery) of the light emitting layer is efficiently guided into the optical guiding member without causing losses, e.g. transmission loss, or attenuations.

Also, in a light emitting apparatus of the present invention, the optical guiding member preferably includes a light reflecting member near the periphery of the optical guiding part which reflects the EL light, emitted from the light emitting layer and transmitted in the optical guiding member, towards the optical guiding part. In the light emitting apparatus, a part of the EL light emitted from the end (outer periphery) of the light emitting layer is transmitted in the optical guiding part without being taken in the optical guiding part and reflected toward the optical guiding part. Therefore, the EL light emitted from the end (outer periphery) of the light emitting layer is efficiently guided by the optical guiding part without causing the losses, e.g. transmission loss, or attenuations.

In a light emitting apparatus of the present invention, the light emitting unit preferably includes a light extracting part where the light emitting unit extract a light from the optical guiding part. In the light emitting apparatus, the light extracting part extracts a light from the optical guiding part, and the light is emitted to the exterior as a linear beam or a laser beam by means of the light emitting unit.

In a light emitting apparatus of the present invention, an EL emitting unit is preferably an EL element. In the light emitting apparatus, the EL emitting unit is the EL element, and therefore the wavelength of the EL emission may be arbitrarily selected.

A light emitting method of the present invention includes: an EL emitting process emitting an EL light from the end of a light emitting layer which generates the EL emission, and a light emitting process emitting a light having a wavelength equivalent to or different from that of the EL light.

In a light emitting method of the present invention, an electroluminescent (EL) light is emitted from the end (outer periphery) of the light emitting layer in the EL emitting process. Then, in the light emitting process, the EL light emitted from the light emitting layer is guided, and the guided EL light is emitted to the exterior as it is or after modulated to a light having a wavelength equivalent to or different from that of the EL light.

DESCRIPTION OF THE PREFERRED EMBODIMENTS

Figure 1:
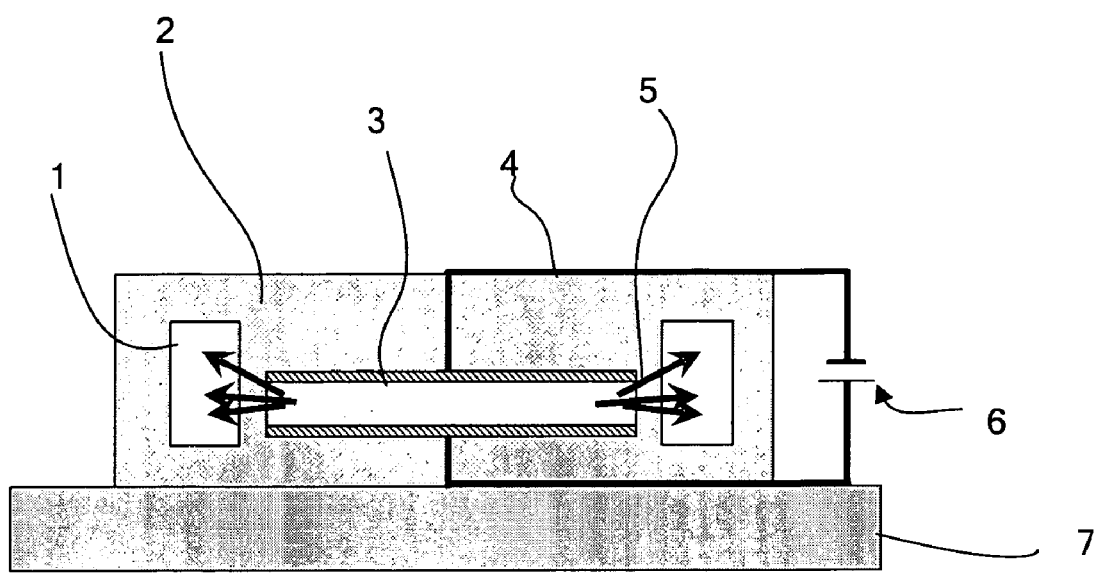
FIG. 1 is a cross-sectional diagram schematically illustrating a light emitting apparatus of the present invention.

Light Emitting Apparatus and Light Emitting Method

A light emitting apparatus of the present invention includes an EL emitting unit, a light emitting unit and other units appropriately selected according to requirements.

A light emitting method of the present invention includes an EL emitting process and a light emitting process, and it further includes other processes appropriately selected according to requirements. The EL emitting process may be favorably performed by means of the EL emitting unit; the light emitting process may be favorably performed by means of the light emitting unit; and the other processes may be favorably performed by means of the other units. Therefore, the light emitting method of the present invention may be favorably performed by means of the light emitting apparatus of the present invention, and the operation of the light emitting apparatus of the present invention is equivalent to the performance of the light emitting method of the present invention.

Hereinafter, the light emitting apparatus of the present invention is described in detail, and through the description the content of the light emitting method of the present invention is disclosed as well.

—EL Emitting Unit and EL Emitting Process—

The EL emitting unit is not particularly restricted as long as it includes at least a light emitting layer and can emit an EL light from the end (outer periphery) of the light emitting layer, and it can be appropriately selected according to applications. An EL element is a favorable example.

Examples of the EL element include an inorganic EL element and an organic EL element. These may be used alone or in combination. Among these, the organic EL element is preferably for its superior emission efficiency.

The shape and the structure of the EL element are not particularly restricted and can be appropriately selected according to applications. For example, it is preferably a flat emitting element.

The layer composition of the EL element is not particularly restricted and can be appropriately selected according to applications. For example, it includes layers such as a light emitting layer, a pair of light blocking layers and an electrode layer, and it further includes other layers appropriately selected according to requirements.

The light emitting process is a process which emits an EL light from the end of the light emitting layer which causes an EL emission. The EL emitting process may be favorably performed by means of the EL emitting unit.

—Light Emitting Layer—

The light emitting layer is not particularly restricted as long as it can generate the electroluminescence (EL) light, and it can be appropriately selected according to applications. For example, it may be formed with an inorganic material or an organic material. Here, the light emitting layer is formed with the organic material when the EL element is the organic EL element. Also, the light emitting layer may be formed as a single-function light emitting layer, or it may be multi-functional as, for example, a light emitting and electron transport layer and a light emitting and hole transport layer.

The light emitting layer is not particularly restricted and can be appropriately selected according to applications. For example, it preferably includes a light emitting material (light emitting element or light emitting molecule). In this case, the light emitting layer may be formed solely with the light emitting material, or it may be formed with materials in combination with the light emitting material. When the light emitting material is included as a guest material, for example, the light emitting layer may be formed including a host material having an emission wavelength close to the light absorbing wavelength the guest material. The host material is preferably included in the light emitting layer, but it may be included in a hole transport layer described hereinafter or an electron transport layer described hereinafter.

Regarding the case where the guest material and the host material are combined, the host material is excited first when the EL light occurs. Then, the emission wavelength of the host material and the absorption wavelength of the guest material (the light emitting material) overlap; therefore, the excitation energy efficiently moves from the host material to the guest material. The host material returns to the ground state without luminescence, and only the guest material (the light emitting material) at an excited state emits the excitation energy as a light; thus, the luminous efficiency and the color purity are superior.

Also, when light emitting molecules exist in a thin film by itself or at a high concentration, an interaction among the light emitting molecules occurs when these light emitting molecules approach one another, and a phenomenon referred to as 'concentration quenching' occurs where the luminous efficiency decreases. In this regard, the combination of the guest material and the host material is advantageous since the light emitting material as the guest compound is dispersed in the host compound at a relatively low concentration, the 'concentration quenching' is effectively suppressed, and the luminous efficiency is superior. Furthermore, the combination of the guest material and the host material in the light emitting layer is advantageous for its superior film-forming property while preserving the luminous properties since the host material is generally superior in terms of film-forming property.

The light emitting material (light emitting elements or light emitting molecules) or the guest material is not particularly restricted and can be appropriately selected according to applications. Examples thereof include fluorescent materials and phosphorescent materials.

Examples of the fluorescent materials include a polycyclic aromatic compound and its derivative such as perylene, 1,3, 6,8-tetraphenylpyrenes and rubrene shown below. Examples of the phosphorescent materials include an iridium complex such as tris(2-phenylpyridine) iridium and a platinum complex such as platinum 3,5-di(2-pyridyl) toluene phenoxide.

These light emitting materials (light emitting element or light emitting molecule) or the guest material may be used alone or in combination of two or more. Among these, the phosphorescent materials such as tris(2-phenylpyridine)iridium and platinum 3,5-di(2-pyridyl) toluene phenoxide are preferably in view of superior luminous efficiency as the EL emitting unit (EL element).

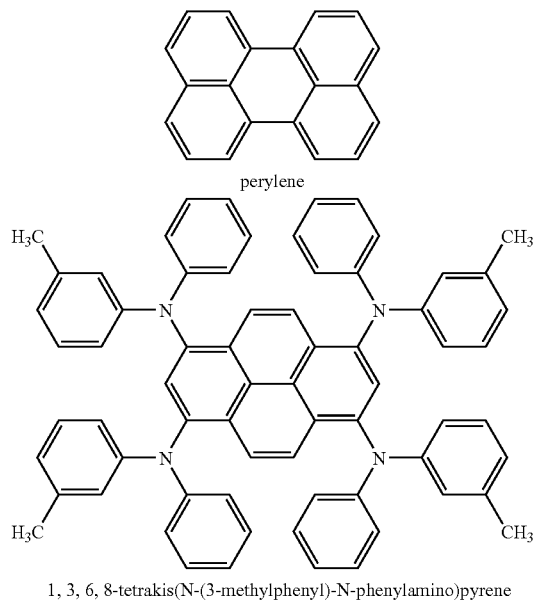

1, 3, 6, 8-tetrakis(N-(3-methylphenyl)-N-phenylamino)pyrene

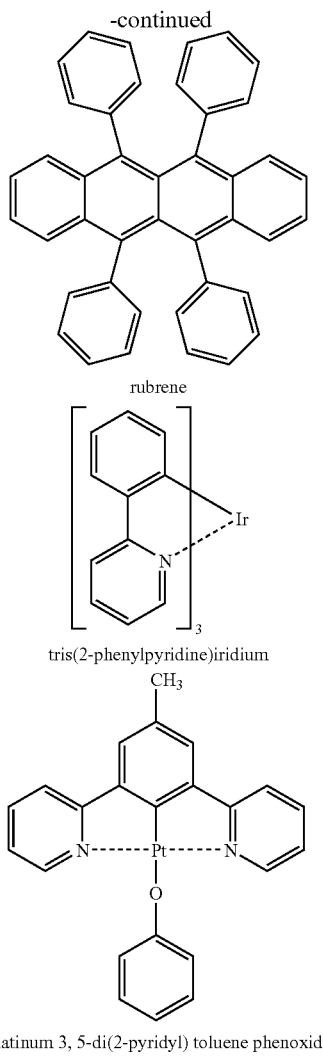

rubrene tris(2-phenylpyridine)iridium

Platinum 3, 5-di(2-pyridyl) toluene phenoxide

The host material is not particularly restricted and can be appropriately selected according to applications, and a material having an emission wavelength near the light absorption wavelength of the guest material is preferable. Favorable examples thereof include: aromatic amine derivatives represented by Structural Formula (1) below; carbazole derivatives represented by Structural Formula (2) below; oxine complexes represented by Structural Formula (3) below; 1,3,6,8-tetraphenylpyrene compounds represented by Structural Formula (4) below; 4,4'-bis(2,2'-diphenylvinyl)-1,1'-biphenyl (DPVBi) having a main emission wavelength of 470 nm, represented by Structural Formula (5); p-sexiphenyl having a main emission wavelength of 400 nm, represented by Structural Formula (6); 9,9'-bianthryl having a main emission wavelength of 460 nm, represented by Structural Formula (7); and polymer materials described hereinafter.

Structural Formula (1)

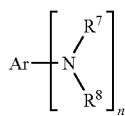

In Structural Formula (1), n represents an integer of two or three; Ar represents a bivalent or trivalent aromatic group or a heterocyclic aromatic group; $R^7$ and $R^8$ are the same or different and represent a monovalent aromatic group or a heterocyclic aromatic group. The monovalent aromatic group or the heterocyclic aromatic group is not particularly restricted and can be appropriately selected according to applications.

Among the aromatic amine derivatives represented by Structural Formula (1) above, N,N'-dinaphthyl-N,N'-diphenyl-[1,1'-biphenyl]-4,4'-diamine (NPD) having a main emission wavelength of 430 nm and its derivatives are preferable.

Structural Formula (1)-1

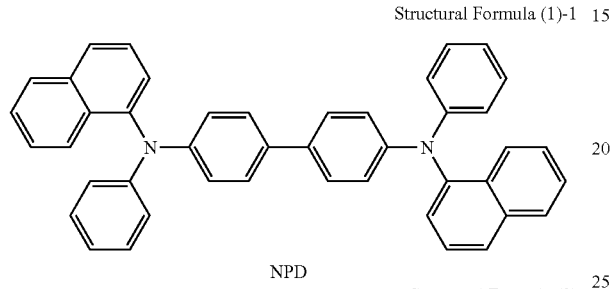

NPD

Structural Formula (2)

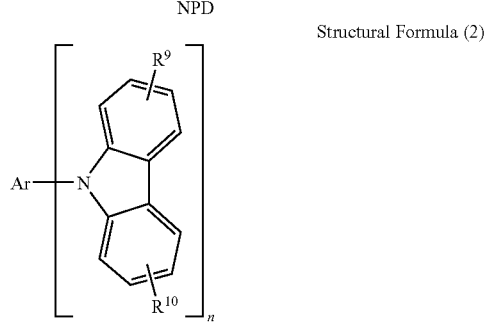

In Structural Formula (2), Ar represents a divalent or trivalent group including an aromatic ring or a divalent or trivalent group including a heterocyclic aromatic ring shown below.

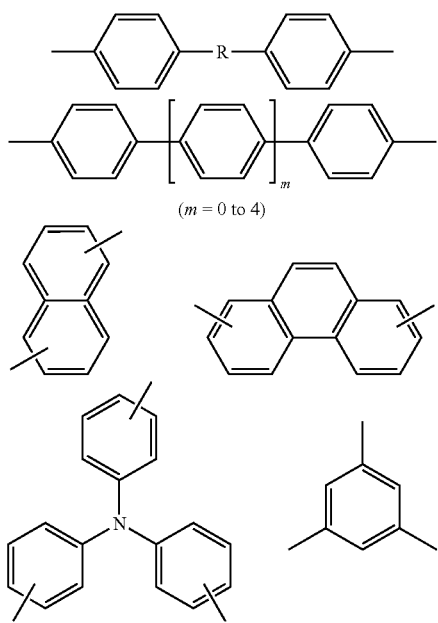

(m = 0 to 4)

-continued

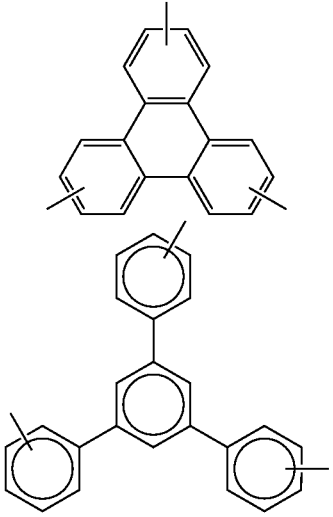

These may be substituted by a nonconjugated group. Also, R represents a connecting group, and favorable examples thereof are shown below:

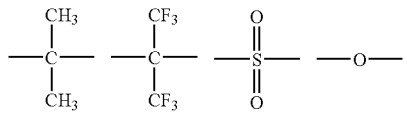

In Structural Formula (2), $R^9$ and $R^{10}$ independently represent a hydrogen atom, a halogen atom, an alkyl group, an aralkyl group, an alkenyl group, an aryl group, a cyan group, an amino group, an acyl group, an alkoxycarbonyl group, a carboxyl group, an alkoxy group, an alkylsulfonyl group, a hydroxyl group, an amide group, an aryloxy group, an aromatic hydrocarbon ring group or an aromatic heterocyclic group, and these may be further substituted by a substituent.

In Structural Formula (2), n represents an integer of favorably two or three.

Among the carbazole derivatives represented by Structural Formula (2), a favorable compound has a structure that Ar is an aromatic group with two benzene rings connected via a single bond, $R^9$ and $R^{10}$ are hydrogen atoms and that n is two. That is, a compound selected from 4,4'-bis(9-carbazolyl)-biphenyl (CBP) having a main emission wavelength of 380 nm and its derivatives, represented by Structural Formula (2)-1 below is preferable in view of superior luminous efficiency.

Structural Formula (2)-1

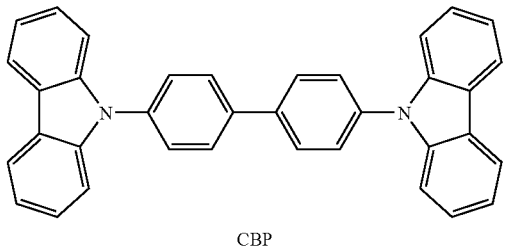

CBP

-continued

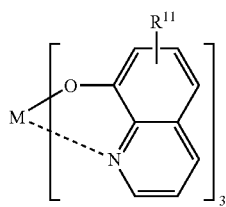

Structural Formula (3)

In Structural Formula (3), $R^{11}$ represents a hydrogen atom, a halogen atom, an alkyl group, an aralkyl group, an alkenyl group, an aryl group; a cyano group, an amino group, an acyl group, an alkoxycarbonyl group, a carboxylic group, an alkoxy group, an alkylsulfonyl group, a hydroxyl group, an amide group, an aryloxy group, an aromatic hydrocarbon ring group or an aromatic heterocyclic group, and these may be further substituted by a substituent.

Among the oxine complexes represented by Structural Formula (3), an aluminum quinoline complex (Alq) having a main emission wavelength of 530 nm represented by Structural Formula (3)-1 is preferable.

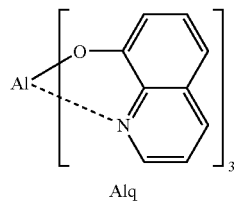

Structural Formula (3)-1

Alq

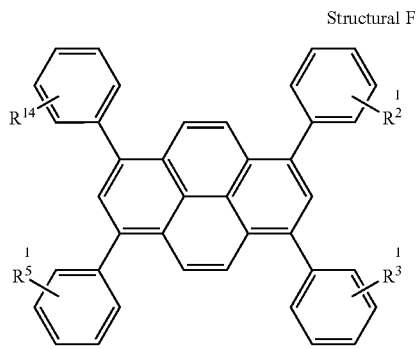

Structural Formula (4)

In Structural Formula (4) above, $R^{12}$ to $R^{15}$ are the same or different and represent a hydrogen atom or a substituent. Favorable examples of the substituent include an alkyl group, a cycloalkyl group and an aryl group, and these may be further substituted by a substituent.

Among 1,3,6,8-tetraphenylpyrenes represented by Structural Formula (4) above, a compound in which $R^{12}$ to $R^{15}$ are hydrogen atoms, i.e. 1,3,6,8-tetraphenylpyrene having a main emission wavelength of 440 nm, represented by Structural Formula (4)-1 below, is preferable in view of superior luminous efficiency.

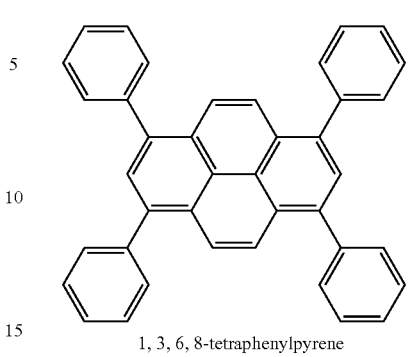

Structural Formula (4)-1

1, 3, 6, 8-tetraphenylpyrene

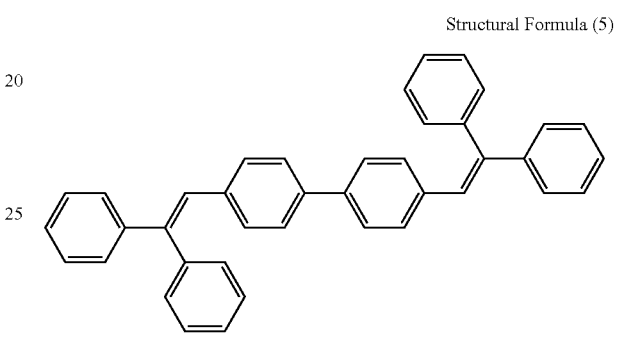

Structural Formula (5)

DPVBi

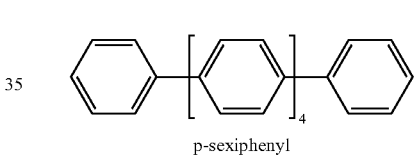

Structural Formula (6)

p-sexiphenyl

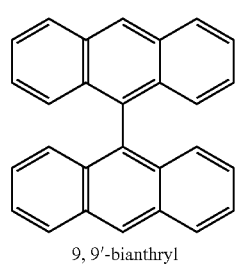

Structural Formula (7)

9, 9'-bianthryl

The host material as a polymer material is not particularly restricted and can be appropriately selected according to applications. It is preferably selected from poly(p-phenylenevinylene) (PPV), polythiophene (PAT), poly(p-phenylene) (PPP), polyvinylcarbazole (PVCz), polyfluorene (PF), polyacetylene and derivatives thereof.

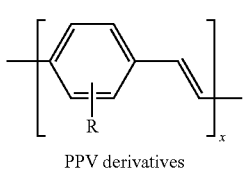 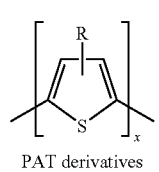

PPV derivatives    PAT derivatives

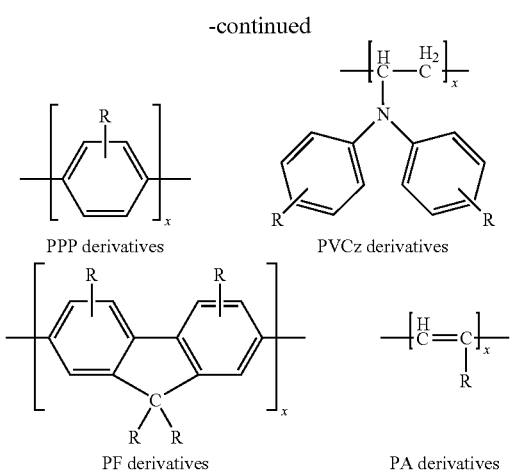

PPP derivatives    PVCz derivatives

PF derivatives     PA derivatives

In the above structural formulae, R represents a hydrogen atom, a halogen atom, an alkoxy group, an amino group, an alkyl group, a cycloalkyl group, an aryl group which may include a nitrogen atom or a sulfur atom or an aryloxyl group, and these may be substituted by a substituent; and x represents an integer.

Among the host materials as a polymer material, a polyvinylcarbazole represented by Structural Formula (8) below is preferable in view of efficient energy transfer from the host material to the guest material.

Structural Formula (8)

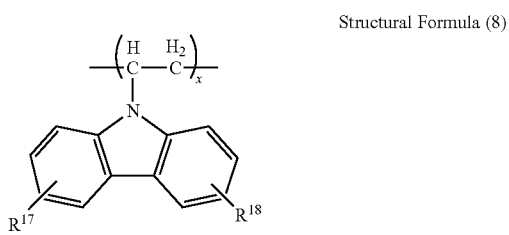

In Structural Formula (8), $R^{17}$ and $R^{18}$ represent multiple substituents attached to an arbitrary location in a cyclic structure, respectively; $R^{17}$ and $R^{18}$ represents respectively a hydrogen atom, a halogen atom, an alkoxy group, an amino group, an alkyl group, a cycloalkyl group, an aryl group which may include a nitrogen atom or a sulfur atom or an aryloxy group, and these may be substituted by a substituent; and arbitrary adjacent substitution sites of the $R^{17}$ and $R^{18}$ may be bonded with each other to form an aromatic bond which may include a nitrogen atom, a sulfur atom and an oxygen atom, and these may be substituted by a substituent; and x represents an integer.

When the host material as a polymer material is used, a coating solution is prepared by dissolving the host material in a medium and by adding the guest material, and then the coating solution is applied with a wet film-forming method such as spin-coating method, inkjet method, dip-coating method and blade-coating method. Here, a hole transport layer material and a electron transport material are mixed in the solution at the same time for film formation for the purpose of enhancing the charge transport properties of the layer to be formed. These wet film-forming methods are favorable when a multifunctional layer such as a hole transport, electron transport and light emitting layer in a single layer.

The content of the light emitting material in the light emitting layer is not particularly restricted and can be appropriately selected according to applications. For example, it is preferably 0.1% by mass to 50% by mass, and more preferably 0.5% by mass to 20% by mass.

When the content is less than 0.1% by mass, the lifetime and emission efficiency may not be sufficient. When it exceeds 50% by mass, the color purity may degrade. On the other hand, the content is preferably in the preferable range in view of superior lifetime and emission efficiency.

When the light emitting layer is formed as multi-functional such as light emitting and electron transport layer and light emitting and hole transport layer, the contents of the light emitting material in these layers are equivalent to the above.

The light emitting layer should only include the following functions. That is, the light emitting layer can inject holes from a positive electrode layer, a hole injection layer and a hole transport layer described hereinafter; it can inject electrons from a negative electrode layer, an electron injection layer and an electron transport layer described hereinafter; furthermore, it can provide a reconnection site for the holes and the electrons; and it can make the light emitting material (light emitting elements or light emitting molecules) to produce luminescence by means of the reconnection energy generated in the reconnection.

The light emitting layer may be formed according to a heretofore known method; for example, it may be favorably formed with a method such as vapor deposition method, wet film-formation method, molecular beam epitaxy (MBE) method, cluster ion beam method, molecular stacking method, LB method, print processes and transfer printing processes.

Among these, the vapor deposition method is preferable in terms of simple and efficient manufacturing at low cost, and the wet film-formation process is also preferable when the light emitting layer is formed as a single-layer structure, for example, a hole transport, light emitting and electron transport layer.

The vapor deposition method is not particularly restricted and can be appropriately selected from heretofore known methods according to applications. Examples thereof include vacuum deposition method, resistance heating deposition method, chemical vapor deposition method and physical vapor deposition method. Examples of the chemical deposition method include a plasma-CVD method, a laser-CVD method, a thermal CVD method and a gas-source-CVD method. The light emitting layer may be favorably formed with the vapor deposition method by performing, for example, a vacuum deposition of the light emitting material or simultaneous vapor deposition of the light emitting material (the guest material) and the host material when the light emitting layer includes the host material other than the light emitting material (the guest material). The former provides simpler manufacturing since it does not require co-deposition.

The wet film-formation method is not particularly restricted and can be appropriately selected from heretofore known methods according to applications. Examples thereof include an inkjet method, a spin-coating method, a kneader-coating method, a bar-coating method, a blade-coating method, a casting method, a dip-coating method and a curtain coating method.

Regarding the wet film-formation method, a solution in which the light emitting layer material is dissolved or dispersed with a resin component may be used such as for coating. Examples of the resin component include polyvinylcarbazoles, polycarbonates, polyvinylchlorides, polystyrenes, polymethylmethacrylates, polyesters, polysurfones, polyphenyleneoxides, polybutadienes, hydrocarbon resins, ketone resins, phenoxy resins, polymamides, ethyl celluloses, vinyl acetates, ABS resins, polyurethanes, melamine resins, unsaturated polyester resins, alkyd resins, epoxy resins and silicone resins.

The light emitting layer may be favorably formed with the wet film-forming method, for example, by using (coating and drying) a solution (coating solution) in which the light emitting material (the guest material) and the optionally used resin material are dissolved in a solvent, or by using (coating and drying) a solution (coating solution) in which the light emitting material (the guest material), the host material and the optionally used resin material are dissolved in a solvent when the light emitting layer includes the host material other than the light emitting material (the guest material).

The thickness of the light emitting layer is not particularly restricted and can be appropriately selected according to applications. For example, it is preferably 5 nm to 80 nm, and more preferably 10 nm to 40 nm.

When the light emitting layer has a thickness in the favorable range, the luminous efficiency, the luminance and color purity of the EL light generated in the light emitting layer are sufficient. The light emitting layer having a thickness in the more favorable range is advantageous since these properties are more prominent. On the other hand, the light emitting layer having a thickness of less than 5 nm may have the degraded luminous efficiency, and the light emitting layer having a thickness exceeding 80 nm may have a significant increase in the driving voltage.

—Pair of Light Blocking Layers—

The pair of light blocking layers is not particularly restricted as long as it can block the EL light generated in the light emitting layer without transmission, and it can be appropriately selected according to applications. For example, it preferably consists of two layers selected from electrode layers (negative electrode layer and positive electrode layer), a hole injection layer, a hole transport layer, an electron blocking layer, a hole blocking layer, an electron transport layer, an electron injection layer, a protective layer, a light reflecting layer and a substrate. In a conventional EL element, the respective layers are formed with transparent materials since the EL light generated in the light emitting layer should be transmitted in the facing direction of the light emitting layer. However, in the present invention, the layers other than the light emitting layer are not necessarily formed with transparent materials since the EL light is radiated from the end (outer periphery) of the light emitting layer. The layers may be formed with light-blocking materials, or at least two layers sandwiching the light emitting layer may be formed with light-blocking materials.

In the present invention, the light emitting layer does not have to be thickened, and the EL light having a sufficient luminous intensity and luminous energy may be radiated from the end (outer periphery) of the light emitting layer even though the light emitting layer is thin. Therefore, among these layers, the pair of light blocking layers of the present invention is most preferably formed with the two light reflecting layers. Also, at least any one of the electrode layers (negative electrode layers and positive electrode layers) may double as the light reflecting layer.

The position of the light reflecting layer is not particularly restricted and can be appropriately selected according to applications. For example, it is preferably arranged outside of the electrode layers (the positive electrode layer and the negative electrode layers), i.e. outermost. This case is preferable since it does not inhibit the functions of the layers, it does not degrade the luminous efficiency in the light emitting layer and it effectively blocks the excess light entering from the outside to the light emitting layer.

Favorable examples of the light reflecting layer have a structure in which any one of a metal layer and a structural layer, in which two or more transparent materials with different refractive indices are periodically repeated, are laminated. In this case, the metal layer is favorable in terms of easy formation.

The material of the metal layer is not particularly restricted and can be appropriately selected according to applications. Examples thereof include Ag, Al, Cr, Au, Mg, Ni and Li. These may be used alone or in combination of two or more. Among these, Ag and Al are preferable in view of high reflectivity and easy formation of the metal layer.

The structural layer in which two or more transparent materials with different refractive indices are periodically repeated is not particularly restricted, and it can be appropriately selected from materials heretofore known as a light reflecting layer. Favorable examples thereof include a structure in which layers formed with $Al_2O_3$, MgO, SiO, $SiO_2$, $TiO_2$, LiF, $MgF_2$, $CaF_2$ and ITO are periodically repeated. The thickness of each layer which constitutes the periodically repeated structure is preferably 100 nm to 1,000 nm.

The insulating layer is not particularly restricted and can be appropriately selected according to applications. The insulating layer may be transparent or colored. The insulating layer material may be, for example, an inorganic material or an organic material.

Examples of the inorganic material include $Al_2O_3$, MgO, SiO, $SiO_2$, $TiO_2$, LiF, $MgF_2$ and $CaF_2$.

As the organic material, for example, resins are a favorable example. Specific examples thereof include polymethylmethacrylates, polycarbonates, polystyrenes, polyimides and epoxy resins.

The thickness of the insulating layer is not particularly restricted and can be appropriately selected according to applications. It is preferably 10 nm to 5 mm, and more preferably 100 nm to 1 mm.

When the thickness of the insulating layer is less than 10 nm, the insulation may not be sufficient. When it exceeds 5 mm, the absorption of the EL light may increase to adversely affect the performance of the element.

The thickness of the pair of light blocking layers is not particularly restricted as long as the EL light generated in the light emitting layer is blocked, and it can be appropriately selected according to applications. It is preferably 10 nm to 1 mm, and more preferably 100 nm to 1,000 nm.

When the thickness of the pair of light blocking layers is less than 10 nm, the light reflectivity may degrade. When it exceeds 1 mm, the mass of the apparatus may be an obstacle.

—Electrode Layers—

The electrode layers are not particularly restricted and can be appropriately selected according to applications.

Examples thereof include a positive electrode layer (anodic layer) and a negative electrode layer (cathodic layer). Among these electrode layers, the positive electrode layer is usually located on the lower side as a lower electrode, and the negative electrode layer is located on the upper side as an upper electrode.

The positive electrode layer is not particularly restricted and can be appropriately selected according to applications. It can preferably supply holes (carrier) towards the light emitting layer.

The positive electrode layer material is not particularly restricted and can be appropriately selected according to applications. Examples thereof include a metal, an alloy, a metal oxide, an electroconductive compound and a mixture thereof. Among these, a material having a work function of 4 eV or greater is preferable.

Specific examples of the positive electrode layer material include: an electroconductive oxide such as tin oxide, zinc oxide, indium oxide, indium tin oxide (ITO); a metal such as gold, silver, chromium, nickel, aluminum and lithium; a mixture or laminates of these metals and electroconductive oxides; an inorganic conductive materials such as copper iodide and copper sulfide; an organic conductive material such as polyaniline, polythiophene and polypyrrole; and laminates of these materials and ITO. These may be used alone or in combination of two or more. Among these, an electroconductive oxide is preferable, and ITO is particularly preferable in view of productivity, high conductivity and transparency.

The thickness of the positive electrode layer is not particularly restricted and can be appropriately selected according to materials. It is preferably 1 nm to 5,000 nm, and more preferably 20 nm to 200 nm.

The positive electrode layer is usually formed on a substrate such as soda lime glass, non alkali glass and transparent resin.

When the glass is used as a substrate, the non alkali glass and the soda lime glass with a barrier coating of silica are preferable in view of reducing the eluted ions from the glass.

The thickness of the substrate is not particularly restricted as long as the substrate is thick enough to maintain its mechanical strength. When the glass is used as the substrate, the thickness is usually 0.2 mm or greater, and it is preferably 0.7 mm or greater.

The positive electrode layer may be favorably formed with a method such as vapor deposition method, wet film-formation method, electron beam method, sputtering method, reactive sputtering method, molecular beam epitaxy (MBE) method, cluster ion beam method, ion-plating method, plasma polymerization method (radiofrequency excitation ion-plating method), molecular stacking method, LB method, print processes, transfer printing processes and method to coat a dispersion of the ITO by means of a chemical reaction method (sol-gel process).

Regarding the positive electrode layer, a cleaning process and other processes may reduce the driving voltage or increase the luminous efficiency. Favorable examples of the other processes include a UV-ozone process and a plasma process when the positive electrode is made of ITO.

The negative electrode layer is not particularly restricted and can be appropriately selected according to applications. Preferably, the negative electrode layer can supply electrons to the light emitting layer.

The negative electrode layer material is not particularly restricted, and can be appropriately selected according to the adhesion between the negative electrodes of the electron transport layer and the light emitting layer and the adjacent layer or molecules, ionization potential and stability. Examples thereof include metals, alloys, metal oxides, electroconductive compounds and mixtures thereof.

Specific examples of the negative electrode layer include: an alkali metal such as Li, Na, K and Cs; an alkali earth metal such as Mg and Ca; gold, silver, lead and aluminum; an alloy or a mixed metal of sodium and potassium; an alloy or mixed metal of lithium and aluminum; an alloy or mixed metal of magnesium and silver; and a rare-earth metal such as indium and ytterbium and an alloy thereof.

These may be used alone or in combination of two or more. Among these, a material having a work function of 4 eV or greater is preferable, and aluminum, an alloy or mixed metal of lithium and aluminum and an alloy or mixed metal of magnesium and silver are more preferable.

The thickness of the negative electrode layer is not particularly restricted and can be appropriately selected according to the negative electrode material. It is preferably 1 nm to 10,000 nm, and more preferably 20 nm to 200 nm.

The negative electrode layer may be favorably formed with a method such as vapor deposition method, wet film-formation method, electron beam method, sputtering method, reactive sputtering method, molecular beam epitaxy (MBE) method, cluster ion beam method, ion-plating method, plasma polymerization method (radiofrequency excitation ion-plating method), molecular stacking method, LB method, print processes and transfer printing processes.

When two or more materials are combined as the negative electrode layer material, the two or more types of materials may be simultaneously deposited to form an alloy electrode, or an alloy prepared alloy may be deposited to form an alloy electrode.

The positive electrode layer and the negative electrode layer preferably have a low resistance. It is preferably several hundred Ω.

—Other Layers—

The other layers are not particularly restricted and can be appropriately selected according to applications. Examples thereof include a hole injection layer, a hole transport layer, an electron blocking layer, a hole blocking layer, an electron transport layer, an electron injection layer and a protective layer.

The hole injection layer is not particularly restricted and can be appropriately selected according to applications. For example, the hole injection layer preferably has a function to inject holes from the positive electrode layer when an electric field is impressed.

The hole injection layer material is not particularly restricted and can be appropriately selected according to applications. Favorable examples include starburst amine represented by the formula below (4,4',4"-tri(2-naphthylphenylamino)triphenylamine, hereinafter referred to also as 2-TNATA), copper phthalocyanines and polyanilines.

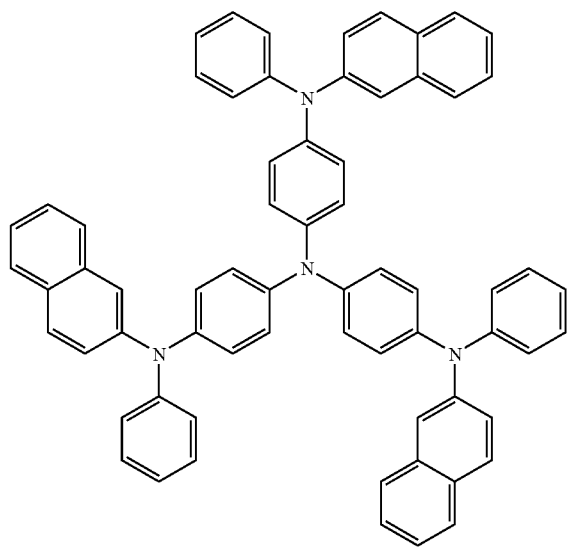

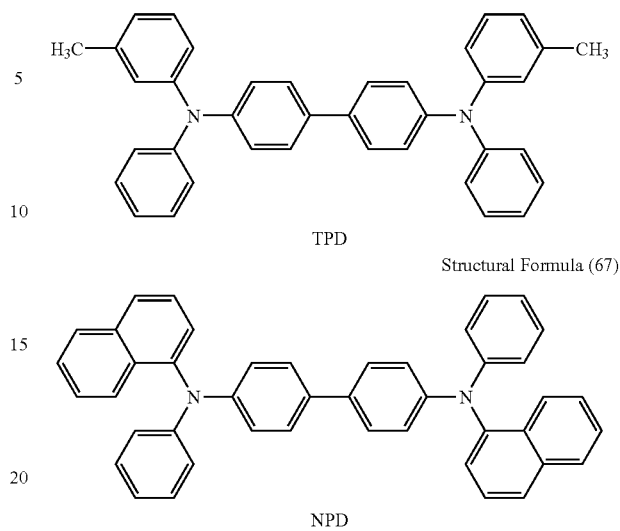

TPD

Structural Formula (67)

NPD

The thickness of the hole injection layer is not particularly restricted and can be appropriately selected according to applications. For example, it is preferably 1 nm to 100 nm, and more preferably 5 nm to 50 nm.

The hole injection layer may be favorably formed with a method such as vapor deposition method, wet film-formation method, electron beam method, sputtering method, reactive sputtering method, molecular beam epitaxy (MBE) method, cluster ion beam method, ion-plating method, plasma polymerization method (radiofrequency excitation ion-plating method), molecular stacking method, LB method, print processes and transfer printing processes.

The hole transport layer is not particularly restricted and can be appropriately selected according to applications. For example, the hole transport layer preferably has a function to transport holes from the positive electrode layer when an electric field is impressed.

The hole transport layer material is not particularly restricted and can be appropriately selected according to applications. Examples thereof include aromatic amine compounds, carbazoles, imidazoles, triazoles, oxazoles, oxadiazoles, polyarylalkanes, pyrazolines, pyrazolones, phenylenediamines, arylamines, amino-substituted chalcones, styrylanthracenes, fluorenones, hydrazones, stilbenes, silazanes, styrylamines, aromatic dimethylidine compounds, porphyrin compounds, polysilane compounds, poly(N-vinylcarbazole), aniline copolymers, thiophene oligomers and polymers, electroconductive high-molecular oligomer or polymer such as polythiophene and a carbon film. A hole transport and light emitting layer may be formed by depositing a film with a mixture of these hole transport layer materials with the light emitting materials.

These may be used alone of in combination of two or more. Among these aromatic amine compounds are preferable, and more specifically, N,N'-diphenyl-N,N'-bis(3-methylphenyl)-[1,1'-biphenyl]-4,4'-diamine (TPD) represented by the formula below and N,N'-dinaphthyl-N,N'-diamine (NPD) represented by Structural Formula (67).

The thickness of the hole transport layer is not particularly restricted and can be appropriately selected according to applications. It is usually 1 nm to 500 nm, and preferably 10 nm to 100 nm.

The hole injection layer may be favorably formed with a method such as vapor deposition method, wet film-formation method, electron beam method, sputtering method, reactive sputtering method, molecular beam epitaxy (MBE) method, cluster ion beam method, ion-plating method, plasma polymerization method (radiofrequency excitation ion-plating method), molecular stacking method, LB method, print processes and transfer printing processes.

The hole blocking layer is not particularly restricted and can be appropriately selected according to applications. For example, the hole blocking layer preferably has a function as a barrier to the holes injected from the positive electrode layer.

The hole blocking layer material is not particularly restricted and can be appropriately selected according to applications.

The holes transported from the side of the positive electrode layer are blocked by the hole blocking layer, and the electrons transported from the negative electrode layer pass through the hole blocking layer and reach the light emitting layer. Then, the electrons and the holes are efficiently reconnected in the light emitting layer while the re-connection between the holes and the electrons in the layers other than the light emitting layer is prevented. Therefore, the aimed luminescence from the light emitting material may be efficiently obtained with the hole blocking layer, which is advantageous in terms of color purity.

The hole blocking layer is preferably arranged between the light emitting layer and the electron transport layer.

The thickness of the hole blocking layer is not particularly restricted and can be appropriately selected according to applications. For example, it is usually 1 nm to 500 nm, and preferably 10 nm to 50 nm.

The hole blocking layer may be a single-layer structure or a laminated structure.

The hole blocking layer may be favorably formed with a method such as vapor deposition method, wet film-formation method, electron beam method, sputtering method, reactive sputtering method, molecular beam epitaxy (MBE) method, cluster ion beam method, ion-plating method, plasma polymerization method (radiofrequency excitation ion-plating method), molecular stacking method, LB method, print processes and transfer printing processes.

The electron transport layer is not particularly restricted and can be appropriately selected according to applications. For example, the electron transport layer preferably has any one of a function to transport the electrons from the negative electrode layer and a function to block the holes injected from the positive electrode layer.

The electron transport layer material is not particularly restricted and can be appropriately selected according to applications. Examples thereof include quinoline derivatives such as aluminum quinoline complex mentioned above, oxadiazole derivatives, triazole derivatives, phenanthroline derivatives, perylene derivatives, pyridine derivatives, pyrimidine derivatives, quinoxaline derivatives, diphenylquinone derivatives and nitro-substituted fluorene derivatives. An electron transport and light emitting layer may be formed by depositing a film with a mixture of these electron transport layer materials with the light emitting materials, and an electron transport, hole transport and light emitting layer may be formed by depositing a film when the mixture is further added with the hole transport layer materials. In this case, polymers such as polyvinylcarbazoles and polycarbonates may be used.

The thickness of the electron transport layer is not particularly restricted and can be appropriately selected according to applications. It is usually 1 nm to 500 nm, and preferably 10 nm to 50 nm.

The electron transport layer may be a single-layer structure or a laminated structure.

The use of an electron transport material which has an optical absorption edge at a shorter wavelength than that of the light emitting material as an electron transport material for the electron transport layer adjacent to the light emitting layer is preferable since it restricts the luminous region of the EL element (the EL emitting unit) is restricted to the light emitting layer and the excess luminescence from the electron transport layer is prevented. Examples of the electron transport material having an optical absorption edge at a shorter wavelength than that of the light emitting material includes phenanthroline derivatives, oxadiazole derivatives and triazole derivatives. Favorable examples include 2,9-dimethyl-4,7-diphenyl-1,10-phenanthroline (BCP) and a compound shown below.

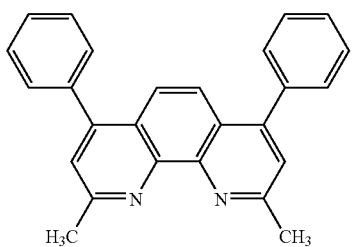

2, 9, Dimethyl-4, 7-diphenyl-1, 10-phenanthroline

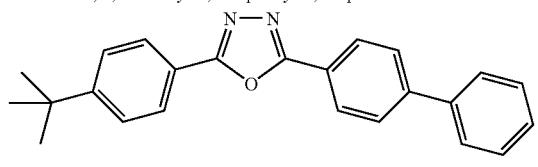

2-(4-tert-Butylphenyl)-5-(4-biphenylyl)-1, 3, 4-oxadiazole

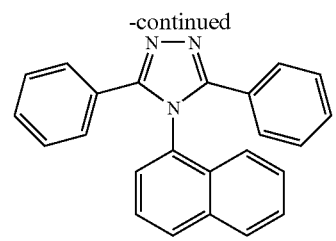

3-Phenyl-4-(1-naphthyl)-5-phenyl-1, 2, 4-triazole

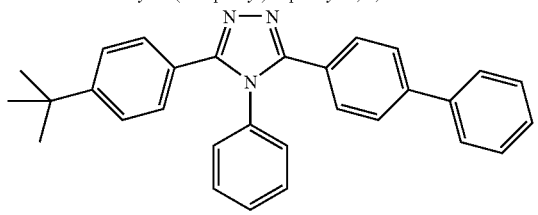

3-(4-tert-Butylphenyl)-4-phenyl-5-(4'-biphenylyl)-1, 2, 4-triazole

The electron transport layer may be favorably formed with a method such as vapor deposition method, wet film-formation method, electron beam method, sputtering method, reactive sputtering method, molecular beam epitaxy (MBE) method, cluster ion beam method, ion-plating method, plasma polymerization method (radiofrequency excitation ion-plating method), molecular stacking method, LB method, print processes and transfer printing processes.

The electron injection layer material is not particularly restricted and can be appropriately selected according to applications. Examples thereof include alkali metal fluorides such as lithium fluoride and alkali-earth metal fluorides such as strontium fluoride.

The thickness of the electron injection layer is not particularly restricted and can be appropriately selected according to applications. It is usually 0.1 nm to 10 nm, and preferably 0.5 nm to 2 nm.

The electron injection layer may be favorably formed with a method such as vapor deposition method, electron beam method and sputtering method.

The protective layer is not particularly restricted and can be appropriately selected according to applications. For example, the protective layer preferably prevents molecules or materials which promote degradation of the EL elements (the EL emitting unit) such as moisture and oxygen from entering the EL elements (the EL emitting unit).

Examples of the protective layer material includes metals such as In, Sn, Pb, Au, Cu, Ag, Al, Ti and Ni; metal oxides such as MgO, SiO, $SiO_2$, $Al_2O_3$, GeO, NiO, CaO, BaO, $Fe_2O_3$, $Y_2O_3$ and $TiO_2$; nitrides such as SiN, $SiN_xO_y$; metal fluorides such as $MgF_2$, LiF, $AlF_3$, $CaF_2$; polyethylene, polypropylene, polymethylmethacrylate, polyimide, polyurethane, polyurea, polytetrafluoroethylene, polychlorotrifluoroethylene, polydichlorodifluoroethylene, a copolymer of chlorotrifluoroethylene and dichlorodifluoroethylene and a copolymer obtained through copolymerization of tetrafluoroethylene and a monomer mixture including at least one co-monomer; a fluorine-containing copolymer having a cyclic structure in the copolymer main chain; water-absorbing materials having a water absorption of 1% or greater; and moisture-proof materials having a water absorption of 0.1% or less.

The protective layer may be favorably formed with a method such as vapor deposition method, wet film-formation method, sputtering method, reactive sputtering method, molecular beam epitaxy (MBE) method, cluster ion beam method, ion-plating method, plasma polymerization method (radiofrequency excitation ion-plating method), print processes and transfer printing processes.

The layer composition in the EL emitting unit (EL element) is not particularly restricted and can be appropriately selected according to applications. Favorable examples thereof include the following layer compositions (1) to (13): (1) positive electrode layer, hole injection layer, hole transport layer, light emitting layer, electron transport layer, electron injection layer, negative electrode layer; (2) positive electrode layer, hole injection layer, hole transport layer, light emitting layer, electron transport layer, negative electrode layer; (3) positive electrode layer, hole transport layer, light emitting layer, electron transport layer, electron injection layer, negative electrode layer; (4) positive electrode layer, hole transport layer, light emitting layer, electron transport layer, negative electrode layer; (5) positive electrode layer, hole injection layer, hole transport layer, light emitting and electron transport layer, electron injection layer, negative electrode layer; (6) positive electrode layer, hole injection layer, hole transport layer, light emitting and electron transport layer, and negative electrode layer; (7) positive electrode layer, hole transport layer, light emitting and electron transport layer, electron injection layer and negative electrode layer; (8) positive electrode layer, hole transport layer, light emitting and electron transport layer and negative electrode layer; (9) positive electrode layer, hole injection layer, hole transport and light emitting layer, electron transport layer, electron injection layer and negative electrode layer; (10) positive electrode layer, hole injection layer, hole transport and light emitting layer, electron transport layer, negative electrode layer; (11) positive electrode layer, hole transport and light emitting layer, electron transport layer, electron injection layer and negative electrode layer; (12) positive electrode layer, hole transport and light emitting layer, electron transport layer and negative electrode layer; and (13) positive electrode layer, hole transport, light emitting and electron transport layer and negative electrode layer. When the EL emitting unit (EL element) includes the hole blocking layer, the hole blocking layer is favorably located between the light emitting layer and the electron transport layer in the layer compositions (1) to (13).

Figure 3:
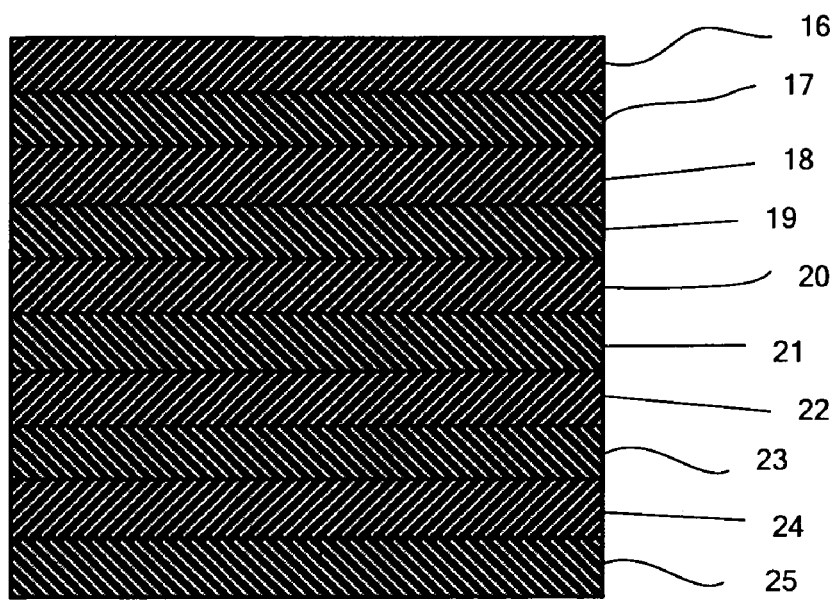
FIG. 3 is a cross-sectional diagram schematically illustrating an exemplary structure of an EL light emitting unit (EL element) in a light emitting apparatus of the present invention.
Figure 4:
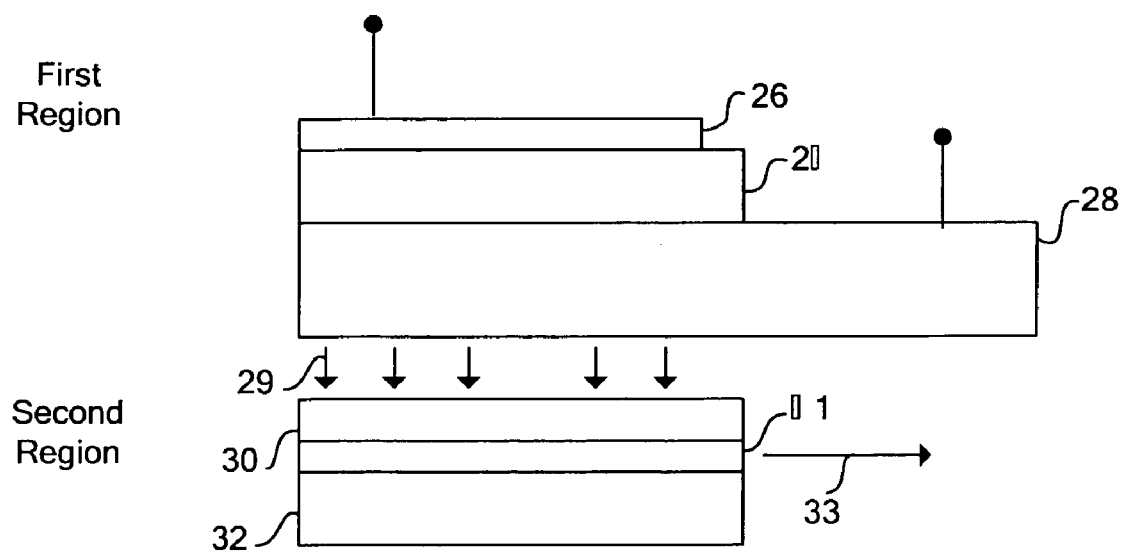
FIG. 4 is a schematic diagram illustrating an example of a conventional optical waveguide organic EL laser apparatus.

Among the layer compositions of the EL emitting unit (EL element), the aspect (4) above (positive electrode layer, hole transport layer, light emitting layer, electron transport layer and negative electrode layer) is shown in FIG. 3, and the EL emitting unit (EL element) has a layer composition which includes on a substrate 25: a light reflecting layer 24; a transparent insulating layer 23; a positive electrode layer 22 such as ITO electrode; a hole injection and transport layer, e.g. 0.001% to 10% dope of tetrafluorotetracyanoquinodimethane ($F_4TCNQ$) with high electron-accepting property shown below; a light emitting layer 20; an electron injection and transport layer 19, e.g. 0.001% to 10% dope of an alkali metal such as lithium and sodium; a negative electrode layer 18, e.g. ITO electrode; a transparent insulating layer 17; and a light reflecting layer in this order. Here, the positive electrode layer 22 and the negative electrode layer 18 are connected to each other through a power supply.

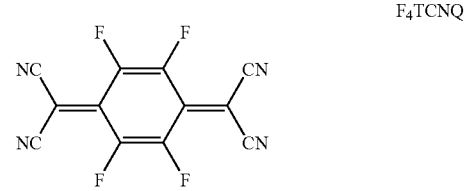

The longer luminance half-life of the light emitting layer is more preferable. For example, in a continuous operation with an electric current density of 50 A/m$^2$, the luminance half-life is preferably 5 hours or greater, more preferably 20 hours or greater, further more preferably 40 hours or greater, and most preferably 60 hours or greater.

The peak wavelength of the EL light in the light emitting layer is not particularly restricted and can be appropriately selected from the ultraviolet to near infrared region. For example, it is preferably 300 nm to 800 nm, and more preferably 350 nm to 650 nm. Here, the peak wavelength should be included in the absorption wavelength region of a light emitting material when the light emitting material is included in the optical guiding part mentioned hereinafter.

Regarding the luminous voltage in the light emitting layer, it produces luminescence at a voltage of desirably 20 V or less, preferably 10 V or less and more preferably 7 V or less.

The electric current efficiency in the light emitting layer with an electric current density of 5 A/m$^2$ is preferably 5 cd/A or greater, more preferably 10 cd/A or greater, and most preferably 20 cd/A or greater.

The number of the EL emitting unit (EL element) is not particularly restricted and can be appropriately selected according to applications. For example, it may be one, two or more. When the number of the EL emitting unit is two or more, the peak wavelength of the EL light in each EL emitting unit may be the same or different.

The manufacturing or forming method of the EL emitting unit (EL element) is not particularly restricted and can be appropriately selected according to applications. Examples thereof include a vapor deposition method, a CVD method, a sputtering method, a coating method such as spin-coating method and a photolithographic method.

These may be used alone or in combination of two or more. Among these, a method which enables easy adjustment of shape of the EL emitting unit is preferable, and the vapor deposition method, the coating method and the sputtering method are more preferable.

As mentioned above, the EL emitting unit (EL element) has a laminated structure including the light emitting layer and a pair of light blocking layers, and the planar shape of the EL emitting unit (EL element), i.e. the shape of its overhead view, may be appropriately selected according to the shape of the optical guiding part in the optical guiding member mentioned hereinafter. For example, when the optical guiding part has a loop structure, the EL emitting unit favorably has a circular form having the same outer peripheral shape as the loop. It is advantageous that the outer peripheral shape of the EL emitting unit (EL element) and the inner peripheral shape of the optical guiding member have the same shape since the losses of light, e.g. connection loss, may be suppressed or decreased when the EL light emitted from the end (outer periphery) of the light emitting layer in the EL emitting unit.

When the EL emitting unit (EL element) has the circular form, the diameter of the EL emitting unit (EL element) is not particularly restricted and can be appropriately selected according to applications. For example, it is preferably 100 µm or greater, and more preferably 200 µm to 10 mm.

When the diameter is less than 100 µm, the luminous intensity of the outgoing light (output light) may be insufficient.

—Light Emitting Unit and Light Emitting Process—

The light emitting unit is not particularly restricted as long as it optically guides the EL light emitted from the end (outer periphery) of the light emitting layer and can emit a light having a wavelength equal to or different from the EL light, and it can be appropriately selected according to applications. For example, it preferably includes an optical guiding member which can guide the EL light in view of suppressing the losses, e.g. transmission loss and connection loss, or the attenuations of the EL light.

The light emitting process optically guides the EL light emitted from the light emitting layer and emits a light having a wavelength equal to or different from the EL light. The light emitting process may be favorably performed with the light emitting unit.

The optical guiding member is not particularly restricted as long as it can optically guide the EL light, and it can be appropriately selected according to applications. For example, it preferably includes an optical guiding part which can optically guide the EL light and a non-optical guiding part which does not optically guide the EL light, and an optical guiding member which functions as an optical resonator is more preferable. This is advantageous since it can emit the incoherent EL light as a coherent laser beam. Here, in the present invention, a light emitted from the light emitting apparatus may be referred to as an outgoing light or an output light.

As a material for the optical guiding part, it preferably does not cause losses, e.g. transmission loss, or attenuations of the EL light; it may be appropriately selected from inorganic materials and organic materials.

The inorganic materials are not particularly restricted and can be appropriately selected according to applications. Examples thereof include $Al_2O_3$, MgO, SiO, $SiO_2$, $TiO_2$, LiF, ITO and glass.

The organic materials are not particularly restricted and can be appropriately selected according to applications, and examples thereof include resins. The resins are not particularly restricted and can be appropriately selected according to applications, and examples thereof include acrylic resins such as polymethylmethacrylates, polycarbonates, silicone resins, polystyrenes, styrene resins such as styrene acrylonitrile, cyclobutene resins, polyimides and epoxy resins. Among these, fluorinated polyimides, benzocyclobutenes, deuterated silicones, deuterated polymethylmethacrylates, UV epoxy resins, UV acrylates and photosensitive polyimides are more preferable.

These may be used alone or in combination of two or more. Among these, photosensitive polyimides are preferable since the optical guiding part which functions as an optical waveform may be formed easily, finely and precisely in a desired shape with the photolithographic method.

The refractive index of the optical guiding part is not particularly restricted and can be appropriately selected according to the refractive index of the non-optical guiding part. For example, it is preferably 1.4 to 1.8, and more preferably 1.5 to 1.7.

When the refractive index is less than 1.4, the light may not be sufficiently confined within the optical guiding part. When it exceeds 1.8, the absorption loss may increase.

The shape and structure of the optical guiding part are not particularly restricted as long as it can optically guide the EL light, and they can be appropriately selected according to applications. For example, a tubular or linear waveguide structure is favorable. These may be used alone or in combination of two or more. Among these, the linear waveguide structure is preferable in view of reducing the loss of the EL light to a maximum extent.

When the optical guiding part has, for example, the linear waveguide structure, the optical guiding part is preferably equipped in the optical guiding member so that no bend section (angular section) occurs in the optical guiding part. A bend section existing in the optical guiding member is not preferable since it may cause losses of the EL light, e.g. bend loss, in the bend section.

The optical guiding part does not have to be equipped linearly in the optical guiding member as long as there is no bend section (angular section) in the optical guiding part, and it may be equipped in a spiral structure, loop structure, circular structure or a curved structure. Among these, the loop structure is particularly preferable. The optical guiding part in a loop structure is advantageous since the EL light guided into the optical guiding part in the loop structure revolves in the optical guiding part, resonates under the condition where the phase of the revolving light and the original phase coincide and becomes a laser beam having a wavelength of the resonating condition, which can be emitted from the light emitting apparatus. Moreover, it is advantageous since it effectively prevents the EL light revolving in the optical guiding part in the loop structure from retrograding to the light emitting layer in the EL emitting unit (EL element).

The cross-sectional shape in the approximate orthogonal direction with respect to the axial direction (long direction) of the optical guiding part is not particularly restricted and can be appropriately selected according to applications. Favorable examples include an approximate circular shape, an elliptical shape, rectangular shape including quadrangles such as approximate square and approximate rectangle, and an indeterminate shape. These may be used alone or in combination of two or more. Among these, the rectangular shape including quadrangles is preferable in view of productivity.

The size of the cross-sectional shape is not particularly restricted and can be appropriately selected according to applications. The size of the cross-sectional shape is preferably small, for example, in view of emitting a linear beam or a laser beam, and the diameter or the greatest dimension of the cross-sectional shape is preferably 1 µm to 100 µm.

The length of the optical guiding part is not particularly restricted as long as losses, e.g. transmission loss, and the attenuations of the EL light is sufficiently small from a practical standpoint, and it can be appropriately selected according to applications. For example, when the optical guiding part includes a light emitting material mentioned hereinafter to modulate the incoherent EL light to a coherent light, the optical guiding part preferably has a sufficient length for this modulation.

The structure of the optical guiding part is not particularly restricted and can be appropriately selected according to applications. It may be formed with a single member, or it may be formed with two or more members. It is preferably formed with a single member in view of reducing losses, e.g. connection loss, of the EL light to a maximum extent.

The size of the optical guiding part is not particularly restricted and can be appropriately selected according to applications. The diameter or the greatest dimension of the cross-sectional shape is larger than the thickness of the light emitting layer in view of the efficient optical guiding (incorporating) of the EL light radiated from the end (outer periphery) of the light emitting layer in the EL emitting unit (EL element). This is preferable in terms of reduction and suppression of losses, e.g. connection loss, of the EL light.

The arrangement of the optical guiding part is not particularly restricted and can be appropriately selected according to applications. The optical guiding part is preferably arranged in the vicinity of the end (outer periphery) of the light emitting layer in view of reduction and suppression of losses, e.g. connection loss, of the EL light as well as efficient optical guiding (entraining) of the EL light radiated from the end (outer periphery) of the light emitting layer in the EL emitting unit (EL element).

The distance between the optical guiding part and the end (outer periphery) of the light emitting layer in the EL emitting unit is not particularly restricted and can be appropriately selected according to applications. The optical guiding part and the light emitting layer may be adjoining or apart, and the distance is preferably 0.1 μm to 2 mm.

When the optical guiding part and the light emitting layer are arranged apart, an air gap may exist or a translucent material may be arranged therebetween. The latter is preferable since the Fresnel reflection loss of the EL light may be reduced or suppressed.

The translucent material is not particularly restricted as long as it has a refractive index smaller than that of the material for the optical guiding part and can optically guide the EL light to the optical guiding part, and it can be appropriately selected according to applications. Translucent materials with superior translucency among the non-optical guiding member materials mentioned hereinafter are favorable.

In the present invention, the optical guiding part most preferably includes a light emitting material which can absorb the EL light radiated from the end (outer periphery) of the light emitting layer of the EL emitting unit (EL element) and can emit a light. In this preferable case, the EL light may be modulated to a light having a desired wavelength, and the incoherent EL light may be emitted as a coherent light under conditions where an induced emission is possible. As a result, the light intensity improvement and the modulation of the light emitted from a light emitting apparatus including the light emitting material become possible, and applications to a variety of uses become possible.

Also, the optical guiding part may include two types of materials, namely a material which absorbs the EL light (host material) and a light emitting material which is excited by means of the energy transportation of the host material and emits a light (guest material). This aspect is advantageous since the concentration of the guest material may be reduced to a low level at which there is no effect of 'concentration quenching' as well as the increase in the concentration of the host material can sufficiently increase the absorption of the EL light in the optical guiding part. Examples of the host material and the guest material included in the optical guiding part are synonymous to those mentioned above. Here, the host material and the guest material included in the optical guiding part do not necessarily have a charge transport function as the host material and guest material mentioned above.

The absorption wavelength range of the light emitting material should overlap with the emission wavelength range of the EL light radiated from the light emitting layer in the EL emitting unit (EL element). The absorption peak wavelength of the light emitting material is located preferably within ±50 nm, and more preferably within ±20 nm, with respect to the EL emission peak wavelength.

When the absorption peak wavelength of the light emitting material is more than 50 nm apart with respect to the emission peak wavelength of the EL light, the absorption and conversion efficiency of the EL light of the light emitting material may degrade. Consequently, losses, e.g. transmission loss, or attenuations of the EL light may occur, and a light with a large luminous intensity may not be emitted. Here, when the optical guiding part includes the light emitting material, the optical guiding part can generally emit to the exterior a light having a peak wavelength longer than the peak wavelength of the EL light.

The light emitting material is not particularly restricted as long as it transits to the excitation state by absorbing the EL light and emits a light upon returning to the ground state, and it can be appropriately selected according to applications. For example, heretofore known laser activated materials may be used, and examples thereof include inorganic compounds and organic compounds.

The inorganic compounds are not particularly restricted and can be appropriately selected according to applications. Rare-earth ions may be given as an example. Specific examples thereof include praseodymium ions, thulium ions, holmium ions, erbium ions, neodymium ions and europium ions.

The organic compounds are not particularly restricted and can be appropriately selected according to applications. Above mentioned rubrene, perylenes and 1,3,6,8-tetraphenylpyrene are favorable examples. When the light emitting material is rubrene, the light emitted from the light emitting apparatus is yellow, which is the luminescent color of the rubrene.

These light emitting materials may be used alone or in combination of two or more. It is preferably used alone in view of rendering the outgoing light a coherent laser beam. Among these, generally in view of a uniform dispersion of the light emitting material to the optical guiding part, the light emitting material is preferably the inorganic compound when the optical guiding member material is an inorganic material, and the light emitting material is preferably the organic compound when the optical guiding member material is an organic material.

The existing state of the light emitting material in the optical guiding part is not particularly restricted and can be appropriately selected according to applications. The light emitting material is preferably uniformly dispersed in view of the amplification or modulation efficiency of the EL light.

The method for uniformly dispersing the light emitting material in the optical guiding part is not particularly restricted and can be appropriately selected according to the types, sizes and the shapes of the light emitting material and the optical guiding part. For example, the both light emitting material and the optical guiding part are organic materials or organic compounds, a method in which the both materials are dissolved in a solvent or melted is favorable.

The content of the light emitting material in the optical guiding part is not particularly restricted and can be appropriately selected according to applications. For example, it is preferably 0.1% by mole to 20% by mole, and more preferably 2% by mole to 10% by mole.

When the content of the light emitting material is less than 0.1% by mole, the amplification or the modulation efficiency of the EL light may not be sufficient, and a light with high luminous intensity or a coherent and highly directional laser beam may not be emitted. When it exceeds 20% by mole, the losses, e.g. transmission loss, or attenuations of the light optically guided into the optical guiding part or the reduction in the luminous efficiency due to the concentration quenching of the light emitting material may occur.

The non-optical guiding part is not particularly restricted as long as the non-optical guiding part itself does not optically guide the EL light and it enables the optical guiding part to optically guide solely the EL light; it can be appropriately selected according to applications.

The arrangement of the non-optical guiding part is not particularly restricted and can be appropriately selected according to applications. For example, it is preferable that the non-optical guiding part is arranged such that it surrounds the periphery of the optical guiding part, and it is particularly preferable that the non-optical guiding part is arranged such that it is embedded in the optical guiding part. In these cases, since the non-optical guiding part exists around the optical guiding part, the EL light entrained in the optical guiding part is reflected at the boundary of the optical guiding part and the non-optical guiding part and proceeds in the optical guiding part without entering the non-optical guiding part or leaking to the exterior from the periphery of the optical guiding part due to the refractive index difference between the optical guiding part and the non-optical guiding part. Therefore, the optical guiding part embedded in the non-optical guiding part functions as an optical waveguide, and this is advantageous since it can suppress effectively the leakage of the light proceeding in the optical guiding part to the exterior, prevent losses, e.g. transmission loss, of the light optically guided in the optical guiding member, and emit a light with high luminous intensity.

The refractive index of the non-optical guiding part is not particularly restricted and can be appropriately selected according to applications. It is preferably smaller than the refractive index of the optical guiding part. In this case, since the refractive index of the non-optical guiding part is smaller than the refractive index of the optical guiding part, the EL light is reflected at the interface between the optical guiding part and the non-optical guiding part, and it proceeds in the optical guiding part without entering the non-optical guiding part. Therefore, the optical guiding part embedded in the non-optical guiding part functions as an optical waveguide, and this is advantageous since it can suppress effectively the leakage of the light proceeding in the optical guiding part to the exterior, prevent losses, e.g. transmission loss, of the light optically guided in the optical guiding member, and emit a light with high luminous intensity. Here, a fiber-optic structure may be formed with the optical guiding part as a core and the non-optical guiding part as a cladding surrounding the core.

The refractive index difference between the optical guiding part and the non-optical guiding part is not particularly restricted and can be appropriately selected according to applications, and it is preferably large. It is preferably 0.05 or greater, and more preferably 0.1 or greater.

When the refractive index difference is less than 0.05, the light may not be sufficiently confined within the optical guiding part. Therefore, the optical guiding efficiency of the EL light may not be sufficient, or the luminous intensity or the luminous energy of the light emitted from the light emitting apparatus may not be sufficient.

The non-optical guiding part material is not particularly restricted and can be appropriately selected according to the refractive index and the form of the optical guiding part. Examples thereof include organic materials and inorganic materials.

The non-optical guiding part may be formed with an air; that is, an air may exist instead of arranging the non-optical guiding part. The air may function as the non-optical guiding part as long as the refractive index of the optical guiding part is larger than the refractive index of the air. Also, when the non-optical guiding part is arranged on a substrate mentioned hereinafter, the substrate preferably functions as the non-optical guiding part as well.

The inorganic materials are not particularly restricted and can be appropriately selected according to applications, and they are synonymous to the exemplary materials given for the optical guiding member such as $Al_2O_3$, MgO, SiO, $SiO_2$, $TiO_2$, LiF, ITO, glass, $MgF_2$ and $CaF_2$.

The organic materials are not particularly restricted and can be appropriately selected according to applications, and they are synonymous to the exemplary materials given for the optical guiding member, and resins are given as a favorable example. The resins are not particularly restricted and can be appropriately selected according to applications, and examples thereof include acrylic resins such as polymethylmethacrylates, polycarbonates, silicone resins, styrene resins such as polystyrenes, styrene acrylonitriles, cyclobutene resins, polyimides and epoxy resins.

These may be used alone or in combination of two or more. Among these, benzocyclobutenes, deuterated silicones, polymethylmethacrylates, UV epoxy resins, UV acrylates, photosensitive polyimides, fluorinated polyimides and translucent polyimides are more preferable, and polymethylmethacrylates are preferable in view of simplicity in covering the optical guiding part and superior handleability and durability.

The methods for forming the optical guiding part and the non-optical guiding part are not particularly restricted and can be appropriately selected according to applications. Examples thereof include a sputtering method, a photolithographic method, coating methods such as spin-coating method, a vapor deposition method, a CVD method, an etching method and a bonding method. These may be used alone or in combination. Among these, a method which can form an arbitrary shape is preferable, and the vapor deposition method, coating method, photolithographic method and etching method are preferable in view of efficient formation of the optical guiding part in a fine and arbitrary shape or structure.

In the present invention, the optical guiding member preferably includes a light reflecting member which reflects the EL light having been radiated from the light emitting layer in the EL emitting unit (EL element) and having passed the optical guiding part towards the optical guiding part. The optical guiding member including the light reflecting member is advantageous since losses of the EL light, e.g. connection loss, may be effectively reduced, and the use efficiency of the EL light is superior.

The arrangement of the light reflecting member is not particularly restricted and can be appropriately selected according to applications. For example, the light reflecting member is preferably arranged near the outer periphery of the optical guiding part which is arranged near the end (outer periphery) of the light emitting layer. In this case, the EL light radiated (leaked) from the end (outer periphery) of the light emitting layer is entrained in the optical guiding part arranged near the end (outer periphery) of the light emitting layer, and there are occasions that a part of the EL light transmits the optical guiding part. However, the light reflecting member arranged near the further outer periphery of the optical guiding part reflects the EL light, which is entrained again to the optical guiding part. As a result, losses, e.g. connection loss, of the EL light radiated (leaked) from the end (outer periphery) of the light emitting layer may be effectively reduced.

The material for the light reflecting layer is not particularly restricted as long as it can reflect the EL light without transmission and can be appropriately selected according to applications. Examples thereof include metals, alloys and dielectric multilayers. These may be used alone or in combination of two or more. Among these, metals are preferable in view of productivity.

The form and structure of the light reflecting member are not particularly restricted and can be appropriately selected according to applications. Favorable examples thereof include a ring wall structure and box structure.

In the present invention, the light emitting unit preferably includes a light extracting part which extracts a light from the optical guiding part and emits the light to the exterior.

Preferably, the light extracting part is optically connected to the optical guiding part in the optical guiding member. The light extracting part optically connected to the optical guiding part is advantageous since losses, e.g. connection loss, or attenuations of the light optically guided to the optical guiding part may be effectively reduced, and a light with high luminous intensity may be emitted.

In order to connect optically the light extracting part and the optical guiding part, they may be arranged close to each other with a spacing of about a light wavelength, and they do not have to be directly connected. A means for the optical connection between the light extracting part and the optical guiding part is not particularly restricted, and heretofore known optical waveguide technologies may be used. For example, a directional connection may be used.

The material for the light extracting part is not particularly restricted and can be appropriately selected according to applications. The materials synonymous to those for the optical guiding part are favorable, and the material for the light extracting and the material for the optical guiding part may be the same or different. Among these materials, polymethylmethacrylates are favorable.

Preferably, the light extracting part is optically connected to the optical guiding part in the optical guiding member. The light extracting part optically connected to the optical guiding part is advantageous since losses, e.g. connection loss, or attenuations of the light optically guided to the optical guiding part may be effectively reduced, and a light with high luminous intensity may be emitted.

The distance between the light extracting part and the optical guiding part is not particularly restricted as long as losses, e.g. connection loss, of the light optically guided in the optical guiding part is sufficiently small from a practical standpoint, and it can be appropriately selected according to applications. For example, it is preferably the distance of approximately the wavelength of the light optically guided in the optical guiding part at the distance of closest approach. In this case, the light extracting part and the optical guiding part may be optically connected, and it is advantageous since losses, e.g. connection loss, of the light may be effectively suppressed. When the distance is greater than the wavelength of the light optically guided in the optical guiding part, the light may not be extracted efficiently from the optical guiding part to the light extracting part, or an extraction of the light may cause losses, e.g. connection loss.

The number of the light extracting part is not particularly restricted and can be appropriately selected according to applications. It may be one, two or more. When the number of the light extracting part is two or more, it is advantageous in terms of function enhancement of the light emitting apparatus.

In addition, the light emitting unit of the present invention preferably includes a light collecting member which can efficiently collect the EL light radiated from the light emitting layer to the optical guiding part between the end (outer periphery) of the light emitting layer in the EL emitting unit (EL element) and the optical guiding part.

The light collecting member is not particularly restricted as long as it can collect the EL light to the optical guiding part, and it can be appropriately selected according to applications. It is preferably formed with materials having superior translucency, and favorable examples thereof include a lens such as collective lens and a waveguide structure. These light collecting members may be used alone or in combination of two or more.

In the present invention, the number of the EL emitting unit and the light emitting unit may be one, respectively, or at least any one of these may be two or more.

The wavelength of the outgoing light emitted by means of the light emitting apparatus or the light emitting method of the present invention is not particularly restricted and can be appropriately selected according to applications. For example, it is preferably 350 nm to 800 nm.

—Other Units and Other Processes—

The other units are not particularly restricted and can be appropriately selected according to applications. Favorable examples include a substrate for fixing the EL emitting unit (EL element) and an optical waveguide forming member.

The substrate is not particularly restricted and can be appropriately selected according to applications. Favorable examples thereof include silicone substrates, glass substrates ($SiO_2$ substrates), plastic substrates and metal substrates. These substrates may be used alone or in combination of two or more.

Among these substrates, silicone substrates, glass substrates and thermally-oxidized silicone substrates ($Si+SiO_2$) are preferable.

In the present invention, the EL emitting unit (EL element) and the light emitting unit (the optical guiding member and the light extracting part, for example) may be formed on the substrate simultaneously or sequentially. This is advantageous since, in this case, the arrangement of the optical guiding part and the light extracting part in the optical guiding member and the control of the positional relation thereof in the optical guiding member may be easily performed, and the optical connection of the light emitting layer to the optical guiding part and the light extracting part may be easily established. In general, establishing an optical connection causes problems that a connection loss tends to occur since the location of the two members which are to be connected should be accurately adjusted and this is not easy. However, as mentioned above, the EL emitting unit, the optical guiding part and the light emitting part are simultaneously or sequentially formed on the substrate with a method such as vapor deposition method, coating method, photolithographic method and etching method; therefore, an optical connection may be easily established.

The optical waveguide forming member is not particularly restricted and can be appropriately selected according to applications. Examples thereof include a ring resonator, a mirror element, a half-mirror element, a branching and merging element, an optical switch, an optical integrated circuit, a ring laser, a total reflecting corner reflector and a grating waveguide. These may be used alone or in combination of two or more.

The other processes are not particularly restricted and can be appropriately selected according to applications.

The manufacturing method of the light emitting apparatus of the present invention is not particularly restricted and can be appropriately selected according to applications. In one method, the EL emitting unit (EL element) and the light emitting unit are separately manufactured, and they are optically connected in the end. In another method, the EL emitting unit (EL element) and the light emitting unit are simultaneously or sequentially formed on the substrate. Among these, the method in which the EL emitting unit (EL element) and the light emitting unit are simultaneously or sequentially formed on the substrate is preferable since the alignment of the EL emitting unit (EL element) and the light emitting unit and the optical connection thereof are easy. Regarding the conventional light emitting diode apparatus and semiconductor laser apparatus, in general, a light emitting diode and a semiconductor laser should be accurately aligned with respect to a separately prepared optical waveguide. This alignment is not easy, and a slight misalignment may cause a connection loss of a light. However, this problem does not occur when the EL emitting unit (EL element), the optical guiding member and the light extracting part are simultaneously formed in the light emitting apparatus of the present invention. Therefore, the light emitting apparatus of the present invention is preferable in terms of effective suppression or reduction of losses, e.g. connection loss, of the light and furthermore the superior manufacturing efficiency.

The manufacturing or forming method of the EL emitting unit (EL element) and the light emitting unit are not particularly restricted and can be appropriately selected according to applications. Examples thereof include a sputtering method, a vapor deposition method such as CVD method, a coating method such as spin-coating method, a photolithographic method and an etching method. These may be used alone or in combination of two or more.

The present invention will be illustrated in more detail with reference to an example given below, but this is not to be construed as limiting the present invention. Here, the performance of the light emitting method of this example is equivalent to the operation of the light emitting apparatus related to this example.

Figure 2:
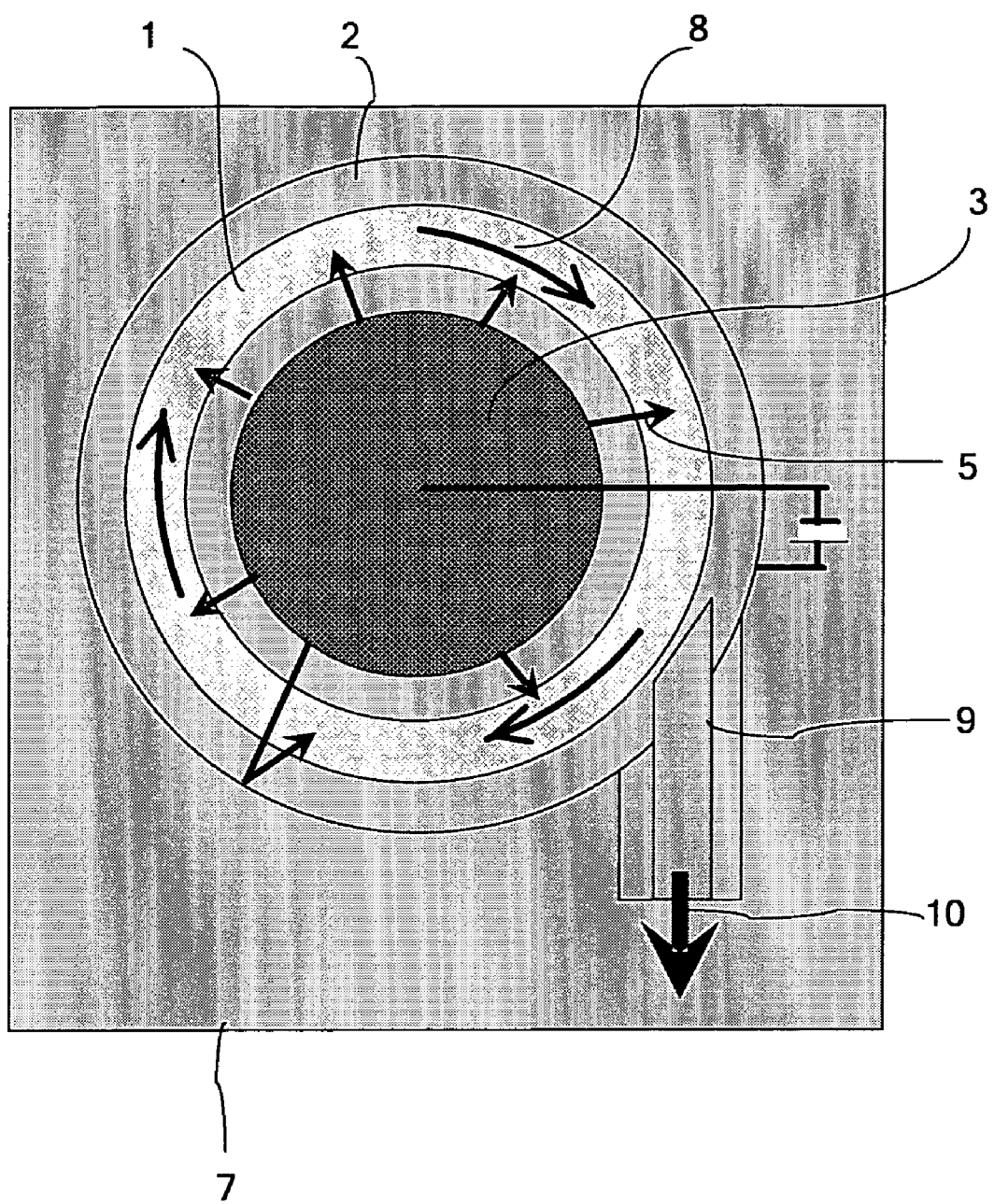
FIG. 2 is a plan view schematically illustrating the light emitting apparatus shown in FIG. 1.

As shown in FIGS. 1 and 2, a light emitting apparatus of the present invention includes an EL emitting unit 3 and a light emitting unit on a substrate 7 (thermally-oxidized silicone ($Si+SiO_2$)).

The EL emitting unit 3 is a flat organic EL element, and as shown in FIG. 3, it includes a structure where a substrate 25, a light reflecting layer 24, a transparent resin layer 23 (with insulation properties), a positive electrode layer 22, a hole injection and transport layer 21, a light emitting layer 20, an electron injection and transport layer 19, a negative electrode layer 18, a transparent layer 17 (with insulation properties) and a light reflecting layer 16 in this order. Here, the positive electrode layer 22 and the negative electrode layer 18 are connected to a power supply 6 through a conductor wire 4.

The EL emitting unit 3 is disposed on the substrate 7, and its planar shape is circular with a diameter of 10 mm. The EL emitting unit 3 was formed as follows. On the substrate 7, first, silver (Ag) was disposed with the sputtering method to form the light reflecting layer 24 on the whole area of the substrate 7 such that the layer had a thickness of 0.1 µm. Next, on the light reflecting layer 24, optically-transparent polyimide (JP-A No. 2000-198842) was applied with the sputtering method to form the transparent resin layer 23 to the whole area of the substrate 7 such that the layer had a thickness of 5 µm. Next, on the transparent resin layer 23, ITO was applied with the sputtering method to form the positive electrode layer 22 such that the layer had a thickness of 0.2 µm and that the layer had a circular form with a diameter of 10 mm. To the positive electrode layer 22, the power supply 6 was electrically connected through the conductor wire 4. On the positive electrode layer 22, the 2-TNATA layer and the NPD layer were sequentially disposed to form the hole injection and transport layer 21 with the vapor deposition method such that the layers had a thickness of 100 nm and 20 nm, respectively, and that the layer had the same shape as the positive electrode layer 22. For the purpose of improving the performance of the hole injection and transport layer 21, the 2-TNATA layer was doped with 0.2% by mole of tetrafluorotetracyanoquinodimethane mentioned above. Then, on the hole injection and transport layer 21, the CBP including 2% by mole of 1,3,6,8-tetrakis(N-(3-methylphenyl)-N-phenylamino)pyrene was disposed to form the light emitting layer 20 with the vapor deposition method such that the layer had a thickness of 30 nm and that the layer had the same shape as the hole injection and transport layer 21. On the light emitting layer 20, the BCP was disposed to form the electron injection and transport layer 19 with the vapor deposition method such that the layer had a thickness of 40 nm and that the layer had the same shape as the light emitting layer 20. For the purpose of improving the performance of the electron injection and transport layer, the electron injection and transport layer 19 was doped with 1% by mole of lithium. On the electron injection and transport layer 19, ITO was disposed to form the negative electrode layer 18 with the vapor deposition method such that the layer had a thickness of 200 nm and a diameter of 9 mm and that the layer was concentric with the electron injection and transport layer 19. On the negative electrode layer 18, LiF was disposed to form the transparent layer 17 with the vapor deposition method such that the layer had a thickness of 2 µm and that the layer had the same shape as the negative electrode layer 18. Furthermore, on the transport layer 17, silver (Ag) was disposed with the vapor deposition method to form the light reflecting layer 16 such that the layer had a thickness of 0.1 µm and that the layer had the same shape as the transparent layer 17. Thus, an EL emitting unit was formed as a green light emitting organic EL element described in JP-A No. 2004-83507. Here, it appears in FIG. 1 that the EL emitting unit 3 (organic EL element) is not directly disposed on the substrate 7, but FIG. 1 includes the light reflecting layer 24 and the transparent layer 23 in the non-optical guiding layer 2 beneath the EL emitting unit 3.

In the EL emitting unit 3, when a voltage is impressed to the positive electrode layer 22 and the negative electrode layer 18 from the power supply 6, holes are injected to the hole injection and transport layer 21 adjacent to the positive electrode layer 22 and transported to the light emitting layer 20, and at the same time, electrons are injected to the electron injection and transport layer 19 adjacent to the negative electrode layer 18 and transported to the light emitting layer 20. Then, in the light emitting layer, the holes and the electrons are coupled, and a light emitting material included in the light emitting layer uses the coupling energy to generate an EL light, which is green having a wavelength of 500 nm in this example. About 80% of the EL light generated in the light emitting layer is radiated to the exterior from its end (outer periphery), and about 20% is radiated from its layer surface to the exterior. However, in the EL emitting unit 3, the about 20% of the light is also radiated to the exterior from the end (outer periphery) of the EL emitting unit 3 since the light emitting layer 20 is sandwiched by the light reflecting layer 24 and the light reflecting layer 16. As a result, about 100% of the EL light is practically radiated from the end (outer periphery) of the EL emitting unit 3.

The light emitting unit includes an optical guiding member, and the optical guiding member includes, as shown in FIGS. 1 and 2, an optical guiding part (optical waveform) 1, a non-optical guiding part 2 and a light extracting part 9.

The optical guiding part 1 is a linear waveform, and it functions as an optical waveform. The optical guiding part 1 was formed after the preparation of the transparent resin layer 23 and prior to the preparation of the positive electrode layer and thereafter in the preparation process of the EL emitting unit 3 by disposing polymethylmethacrylate mentioned above (refractive index: 1.49) including 10% by mole of rubrene mentioned above to form the optical guiding part 1 as a linear waveguide having a loop structure near the outer periphery of the EL emitting unit 3 formed on the substrate 7 such that the gap with the end (outer periphery) of the EL emitting unit 3 was 0.1 mm and that the optical guiding part had a thickness of 4 µm and the width of 4 µm. The rubrene optically guides an EL light 5 generated in the light emitting layer 20 in the EL emitting unit 3 to the interior as well as emits (modulates) a yellow light having a longer wavelength than the EL light 5 of 560 nm. Here, it appears in FIG. 1 that the optical guiding part 1 is not directly disposed on the substrate 7, but in this example the light reflecting layer 24 and the transparent layer 23 exist in the non-optical guiding layer 2 beneath the EL emitting unit 3.

The non-optical guiding part 2 is disposed such that the non-optical guiding part 2 covers the surface of the optical guiding part 1 disposed on the substrate 7 with the substrate 7 and that it further covers the surfaces of the EL emitting unit 3 (organic EL element) and the light extracting part 9 mentioned below. The non-optical guiding part 2 is formed with the vapor deposition method by using LiF (refractive index: 1.39). Since the non-optical guiding part 2 also covers the surface of the EL emitting unit 3 (organic EL element), it functions as a protective layer of the EL emitting unit 3.

The non-optical guiding part 2 has the same shape as the end (outer periphery) of the optical guiding part 1, and it includes a light reflecting member (a reflective film formed with silver (Ag) in a ring structure) which reflects the EL light 5 having been radiated from the light emitting layer 20 and having passed the optical guiding part 1. In the light emitting apparatus, a part of the EL light 5 radiated from the end (periphery) of the light emitting layer 20 which has passed the optical guiding part 1 without being entrained in the optical guiding part 1 is reflected towards the optical guiding part 1. Therefore, the EL light 5 radiated from the end (outer periphery) of the light emitting layer 20 is optically guided by means of the optical guiding part 1 in an efficient manner without causing losses, e.g. connection loss, or attenuations of the EL light 5.

The light extracting part 9 functions as an optical waveguide, and it extracts a part of a light 8 from the optical guiding part 2 as an optical resonator. The light extracting part 9 was formed on the substrate 7 with the photolithographic method by disposing a translucent polyimide described in JP-A No. 2000-198842 (refractive index: 1.6) such that the part had a thickness of 4 µm and a width of 4 µm. The light extracting part 9 is arranged with respect to the optical guiding part 1, with a spacing of approximately a light wavelength (500 nm) required for an optical connection. Here, the light extracting part 9 is formed simultaneously with the optical guiding part 1.

In the light emitting apparatus of this example, the EL emitting unit 3 radiates about 100% of the electroluminescent (EL) light 5 generated in the light emitting layer 20 from its end (outer periphery). This EL light 5 is entrained in the optical guiding part 1 in the optical guiding member of the light emitting unit. Since the optical guiding part 1 and the light emitting layer 20 are optically connected, losses, e.g. connection loss and transmission loss, or attenuations of the EL light may be suppressed or reduced, and the EL light is entrained in the optical guiding part without practical losses. Since the optical guiding part 1 is designed as a linear waveform in a loop structure, the excitation density of the outgoing light (output light) emitted from the tip of the light extracting part 9 may be adjusted to a desired level by adjusting the size (area) of the light emitting layer 20 of the EL emitting unit 3, and thus the excitation density may be sufficiently increased. In other words, on one hand, the luminous energy of the EL light generated in the light emitting layer of the EL emitting unit 3 is proportional to the square of the radius of the EL emitting unit 3 while the density of the driving current in the EL emitting unit is constant and directly proportional to the size (area) of the light emitting layer of the EL emitting unit 3. On the other hand, since the length of the optical guiding part 1 as the linear waveguide located opposite to the EL emitting unit 3, i.e. located surrounding the EL emitting unit 3, is directly proportional to the radius of the EL emitting unit. Therefore, the increase in the size (area) of the light emitting layer in the EL emitting unit 3 monotonously increases the excitation density in the optical guiding part 1 as the linear waveguide. As a result, the adjustment of the size (area) of the light emitting layer in the EL emitting unit can turn the light emitted from the light emitting apparatus into a laser beam, i.e. provide a laser oscillation.

Also, in the light emitting apparatus, the rubrene as a light emitting material absorbs the EL light 5 and transits to an excited state, and it emits a light when it returns to the ground state (the EL light 5 is modulated or amplified to a light 8 having a different wavelength from the EL light). Therefore, an emission of a light 10 having a different wavelength from the EL light 5 is induced and emitted to the outside, and the resulting light has superior luminous intensity and luminous energy. Here, the increase in the electric current injected in the light emitting layer 20 in the EL emitting unit 3 increase the luminous intensity and the luminous energy of the EL light 5 generated in the light emitting layer 20, and this increase in the luminous intensity and the luminous energy of the EL light 5 increases the excitation density of the rubrene as the light emitting material as well. When the excitation density of the light emitting material exceeds its threshold, the laser oscillation occurs, and an outgoing light 10 (output light) as the laser beam is emitted from the light emitting apparatus.

Furthermore, the optical guiding part 1 of the light emitting apparatus has a loop structure, and the EL light 5 optically guided into the optical guiding part 1 circles in the optical guiding part 1. The circling light resonates under the condition where the phase of the circling light coincides with the original phase. As a result, a laser beam to be emitted has a wavelength of the resonance condition, and the light emitting apparatus can emit a laser beam as an outgoing light (output light) 10.

Furthermore, in the light emitting apparatus, the refractive index difference between the optical guiding part 1 and the non-optical guiding part 2 prevents the EL light 5, which is likely to leak out to the exterior from the periphery, from entering the non-optical guiding part 2. The EL light is reflected at the boundary between the optical guiding part 1 and the non-optical guiding part 2, and it proceeds within the optical guiding part 1. Therefore, the optical guiding part 1 serves as an optical waveguide, effectively suppressing the leak of the light 8 proceeding in the optical guiding part 1 to the exterior as well as reducing or suppressing losses of the light guided into the optical guiding part 1, e.g. transmission loss, or attenuations, and it can emit an outgoing light (output light) 10 with large luminous intensity.

The light emitting apparatus and the light emitting method of the present invention may be favorably applied in various fields; for example, it may be favorably used as a laser apparatus or a laser pointer which can emit a linear beam or a laser beam.

According to the present invention, a high-performance light emitting apparatus which can resolve the conventional problems, can emit an electroluminescent (EL) light or an EL-oriented light as a linear beam or a laser beam, costs less and is smaller in size than the semiconductor laser, can emit a linear beam having a wavelength different from that of a conventional laser beam, enables easy modulation and is favorable in various fields; and a light emitting method thereof.

What is claimed is:

1. A light emitting apparatus comprising:
an EL emitting unit, and
a light emitting unit,
wherein the EL emitting unit comprises: a light emitting layer which generates an EL light; and a pair of light blocking layers which blocks the EL light generated in the light emitting layer without transmission and allows the radiation of the EL light only from an outer periphery of the light emitting layer,
wherein the light blocking layers are arranged such that they sandwich the light emitting layer; and
the light emitting unit optically guides the EL light radiated from the outer periphery of the light emitting layer and emits a light having a wavelength equal to or different from that of the EL light.

2. The light emitting apparatus according to claim 1,
wherein the light emitting unit comprises an optical guiding member which optically guides the EL light radiated from the end of the light emitting layer.

3. The light emitting apparatus according to claim 2,
wherein the optical guiding member comprises an optical guiding part and a non-optical guiding part.

4. The light emitting apparatus according to claim 3,
wherein the optical guiding part comprises a light emitting material which absorbs the EL light radiated from the light emitting layer and produces luminescence.

5. The light emitting apparatus according to claim 2,
wherein the optical guiding part has a loop structure; and
the optical guiding member functions as an optical resonator.

6. The light emitting apparatus according to claim 5,
wherein the absorption peak wavelength of the light emitting material is located within ±50 nm with respect to the EL emission peak wavelength.

7. The light emitting apparatus according to claim 5,
wherein the light emitting material is uniformly dispersed in the optical guiding part.

8. The light emitting apparatus according to claim 5,
wherein the light emitting material is an organic compound.

9. The light emitting apparatus according to claim 4,
wherein the refractive index of the non-optical guiding part is smaller than the refractive index of the optical guiding part.

10. The light emitting apparatus according to claim 4,
wherein the optical guiding part is embedded in the non-optical guiding part.

11. The light emitting apparatus according to claim 4,
wherein the optical guiding part is tubular.

12. The light emitting apparatus according to claim 4,
wherein the cross-sectional shape of the optical guiding part in an axial direction is an approximate circular shape.

13. The light emitting apparatus according to claim 4,
wherein the optical guiding part is arranged near the outer periphery of the light emitting layer.

14. The light emitting apparatus according to claim 3,
wherein the optical guiding member comprises a light reflecting member arranged near the outer periphery of the optical guiding part; and
the light reflecting member reflects the EL light having been radiated from the light emitting layer and having passed through the optical guiding part towards the optical guiding part.

15. The light emitting apparatus according to claim 3,
wherein the light emitting unit comprises a light extracting part which extracts a light from the optical guiding part.

16. The light emitting apparatus according to claim 1,
wherein an outgoing light emitted from the light emitting unit has a wavelength of 350 nm to 800 nm.

17. The light emitting apparatus according to claim 1,
wherein the EL emitting unit is an EL element.

18. The light emitting apparatus according to claim 1,
wherein the pair of light blocking layers are any two layers selected from: a positive electrode layer, a hole injection layer, a hole transport layer, an electron blocking layer, a hole blocking layer, an electron transport layer, an electron injection layer, a negative electrode layer, a protective layer and a light reflecting layer.

19. The light emitting apparatus according to claim 1,
wherein the EL emitting unit comprises a positive electrode layer and a negative electrode layer;
the pair of light blocking layers comprises light reflecting layers;
and the light reflecting layers are arranged outside of the positive electrode layer and the negative electrode layer, respectively.

20. A light emitting method comprising:
an EL emitting process which emits an EL light from an outer periphery of a light emitting layer; and
a light emitting process which optically guides the EL light emitted from the light emitting layer and emits a light having a wavelength equal to or different from that of the EL light,
wherein the light emitting layer produces luminescence.

* * * * *